US012710790B2

(12) United States Patent
Won et al.

(10) Patent No.: US 12,710,790 B2
(45) Date of Patent: Aug. 18, 2026

(54) DISPLAY DEVICE

(71) Applicant: Samsung Display Co., LTD., Yongin-si (KR)

(72) Inventors: Seong Geun Won, Yongin-si (KR); Dong Jo Kim, Yongin-si (KR); Hyun Kim, Yongin-si (KR); Je Won Yoo, Yongin-si (KR); Seung Min Lee, Yongin-si (KR); Dan Bi Choi, Yongin-si (KR); Souk June Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 116 days.

(21) Appl. No.: 18/623,966

(22) Filed: Apr. 1, 2024

(65) Prior Publication Data

US 2025/0053199 A1 Feb. 13, 2025

(30) Foreign Application Priority Data

Aug. 7, 2023 (KR) ........................ 10-2023-0102667

(51) Int. Cl.

| | |
|---|---|
| ***G06F 1/16*** | (2006.01) |
| ***G09F 9/30*** | (2006.01) |
| ***G09G 3/00*** | (2006.01) |
| ***H10K 59/80*** | (2023.01) |
| ***H10K 77/10*** | (2023.01) |

(52) U.S. Cl.

CPC ............ *G06F 1/1652* (2013.01); *G09F 9/301* (2013.01); *G09G 3/035* (2020.08); *H10K 59/80* (2023.02); *H10K 77/111* (2023.02); *G09G 2330/04* (2013.01)

(58) Field of Classification Search

CPC .. G06F 1/1652; G09G 3/035; G09G 2330/04; H10K 77/111; H10K 59/80; H10K 59/1201; G09F 9/301; B32B 2457/20; B32B 3/08; B32B 3/30; B32B 19/04; B32B 27/06; B32B 38/10

See application file for complete search history.

(56) References Cited

U.S. PATENT DOCUMENTS

| | | | | |
|---|---|---|---|---|
| 9,276,055 | B1 * | 3/2016 | Son | H10D 86/423 |
| 9,430,180 | B2 * | 8/2016 | Hirakata | G06F 3/1446 |
| 10,141,540 | B2 * | 11/2018 | Sung | H10K 59/124 |
| 10,649,267 | B2 * | 5/2020 | Tuan | G02F 1/136 |

(Continued)

FOREIGN PATENT DOCUMENTS

| | | |
|---|---|---|
| CN | 104299518 B | 6/2016 |
| CN | 109671746 B | 4/2021 |

(Continued)

*Primary Examiner* — Allen L Parker
*Assistant Examiner* — Martin Antonio Asmat Uceda
(74) *Attorney, Agent, or Firm* — Womble Bond Dickinson (US) LLP

(57) ABSTRACT

A display device includes a first substrate including a first area, a second area, and a bending area that is between the first area and the second area, and including a second inclined surface facing the bending area, a light-emitting element at the first area, and a first bending-protection layer at the first area and the second area, not overlapping the bending area, and including a first inclined surface facing the bending area and aligned with the second inclined surface.

12 Claims, 14 Drawing Sheets

(56) References Cited

U.S. PATENT DOCUMENTS 10,714,562 B2 * 7/2020 Yang .................... H10K 59/873
10,910,589 B2 * 2/2021 Jeong ................... H10K 77/111
10,936,096 B2 * 3/2021 Bai ....................... G06F 1/1626
11,308,829 B2 * 4/2022 Xie ..................... H04M 1/0266
11,444,139 B2 * 9/2022 Wang ................... H10K 59/122
11,773,004 B2 * 10/2023 Hackert .............. C03B 33/0222
428/131
2017/0270878 A1 * 9/2017 Moriyama ........ G02F 1/134336
2017/0302772 A1 * 10/2017 Zhang ................. H04M 1/0268
2018/0182829 A1 * 6/2018 Shin ...................... G06F 1/1652
2018/0350701 A1 * 12/2018 Kim ....................... H10D 86/60
2018/0351117 A1 * 12/2018 Kim ..................... H10K 59/127
2019/0040215 A1 * 2/2019 Murata ...................... C08J 5/18
2019/0207130 A1 * 7/2019 He ....................... H10K 77/111
2019/0259968 A1 * 8/2019 Choi .................... H10K 59/131
2019/0369667 A1 * 12/2019 Yug ....................... G06F 1/1626
2020/0077508 A1 * 3/2020 Uogishi ................... H05K 3/28
2020/0174526 A1 * 6/2020 Jeong ...................... G09F 9/301
2020/0271976 A1 * 8/2020 Koide ............... G02F 1/133311
2020/0404773 A1 * 12/2020 Uogishi ................. H05K 1/028
2022/0115473 A1 * 4/2022 Han ..................... H10K 77/111
2022/0115625 A1 * 4/2022 Yu ........................ H10K 59/131
2022/0246649 A1 * 8/2022 Liang ..................... H10K 71/00
2022/0302405 A1 * 9/2022 Choi ...................... H10K 59/38
2022/0328791 A1 * 10/2022 Qian ......................... B32B 7/12
2024/0313007 A1 * 9/2024 Lu .......................... H10D 86/60

FOREIGN PATENT DOCUMENTS

JP 2006-066080 A 3/2006
KR 20200005691 A * 1/2020 ................ C09J 7/38
KR 2020-0041408 A 4/2020
KR 2020-0080752 A 7/2020

* cited by examiner

PA : A1, A2, A3
110 : 110a1, 110a2, 110a3
112a : 112a3
115a : 115a3
125a : 125a3
155a : 155a3
450a : 450a1, 450a2, 450a3

DISPLAY DEVICE

CROSS-REFERENCE TO RELATED APPLICATION

The present application claims priority to, and the benefit of, Korean Patent Application No. 10-2023-0102667, filed on Aug. 7, 2023, in the Korean Intellectual Property Office, the entire disclosure of which is incorporated herein by reference.

BACKGROUND

1. Field

The present disclosure relates to a display device.

2. Description of the Related Art

As an information society develops, the demand for a display device for displaying an image is increasing in various forms. The display device may be a flat panel display, such as a liquid crystal display, a field emission display, or a light-emitting display panel.

The display device includes a display area for displaying images and a non-display area located around the display area, for example, to surround the display area. Recently, a width of the non-display area has been gradually reduced to increase immersion in the display area and enhance the aesthetics of the display device.

Meanwhile, to reduce the width of the non-display area, a bending area may be formed between a pad area and the display area, and the pad area may be positioned below a display panel by bending the bending area. In this case, a substrate made of a flexible material that may be bent is used, and a substrate made of a hard material may be further included to maintain a shape as a size of the substrate increases.

SUMMARY

Aspects of the present disclosure provide a display device capable of preventing cracks and peeling defects that occur when a substrate is bent.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to one or more embodiments of the disclosure, a display device includes a first substrate including a first area, a second area, and a bending area that is between the first area and the second area, and including a second inclined surface facing the bending area, a light-emitting element at the first area, and a first bending-protection layer at the first area and the second area, not overlapping the bending area, and including a first inclined surface facing the bending area and aligned with the second inclined surface.

The first bending-protection layer may include a first portion and a second portion spaced apart from each other with the bending area interposed therebetween, the first portion including the first inclined surface, and the second portion including a third inclined surface facing the bending area.

The first substrate may include a third portion and a fourth portion spaced apart from each other with the bending area interposed therebetween, the third portion overlapping the first portion, and the fourth portion overlapping the second portion.

The fourth portion may include a fourth inclined surface facing the bending area and aligned with the third inclined surface.

The first portion may further include a first surface facing the first substrate, and a second surface opposite to the first surface, wherein a first inclined angle formed by the first surface and the first inclined surface is an acute angle.

The first inclined angle may be about 60° or more and about 90° or less.

The second surface may include a heat-affected zone recessed vertically with respect to the second surface.

The second surface may include a heat-affected zone protruding vertically with respect to the second surface.

A width of the heat-affected zone in a direction parallel to the first substrate may be about 10 μm or more and about 100 μm or less.

The display device may further include a second bending-protection layer overlapping the bending area, and having a thickness of about 50 μm or more and about 200 μm or less.

The display device may further include a signal line for transmitting an electrical signal to the light-emitting element, not overlapping with the first bending-protection layer, and overlapping the second bending-protection layer.

The display device may further include a via layer and a pixel definition layer between the first substrate and the first bending-protection layer, and including inclined surfaces facing the bending area aligned with the first inclined surface and the second inclined surface.

According to one or more embodiments of the disclosure, a display device includes a first substrate including a first area, a second area, and a bending area between the first area and the second area, a light-emitting element at the first area of the first substrate, a first bending-protection layer at the first area, the bending area, and the second area of the first substrate, and a second substrate above the first substrate, wherein the first substrate includes a first sub-substrate and a second sub-substrate spaced apart from each other with the bending area interposed therebetween, wherein the first sub-substrate includes a first inclined surface in a direction toward the bending area, wherein the second sub-substrate includes a second inclined surface in a direction toward the bending area, and wherein the first inclined surface and the second inclined surface overlap the first bending-protection layer.

The first bending-protection layer may overlap the bending area and includes a third inclined surface in a direction toward a distal end of the second substrate, wherein the second substrate includes a fourth inclined surface in a direction toward the distal end of the second substrate.

The third inclined surface and the fourth inclined surface may be aligned.

The display device may further include a second bending-protection layer overlapping the first area and the second area, and connected to the first bending-protection layer, wherein the second bending-protection layer has a thickness decreasing in a direction toward a distal end of the second substrate.

The second bending-protection layer might not overlap the first inclined surface and the second inclined surface.

The thickness of the second bending-protection layer may be less than about 50 μm.

The second bending-protection layer overlapping the first area and the second bending-protection layer overlapping the second area may be connected by the first bending-protection layer, wherein the first bending-protection layer and the second bending-protection layer are integral.

The first bending-protection layer may overlap the first area and the second area, and includes a fifth inclined surface in the direction toward the distal end of the second substrate, wherein the second substrate overlaps the first area and the second area, and includes a sixth inclined surface in the direction toward the distal end of the second substrate, and wherein the fifth inclined surface and the sixth inclined surface are aligned.

Details of other embodiments are included in the detailed description and drawings.

According to the display device according to embodiments, as the bending-protection layer overlapping the bending area has a substantially uniform thickness, cracks and peeling defects occurring in the bending area may be reduced.

However, the effects of the embodiments are not restricted to the one set forth herein. The above and other effects of the embodiments will become more apparent to one of daily skill in the art to which the embodiments pertain by referencing the claims.

BRIEF DESCRIPTION OF THE DRAWINGS

The above and other aspects of the present disclosure will become more apparent by describing in detail embodiments thereof with reference to the attached drawings, in which.

DETAILED DESCRIPTION

Figure 1:
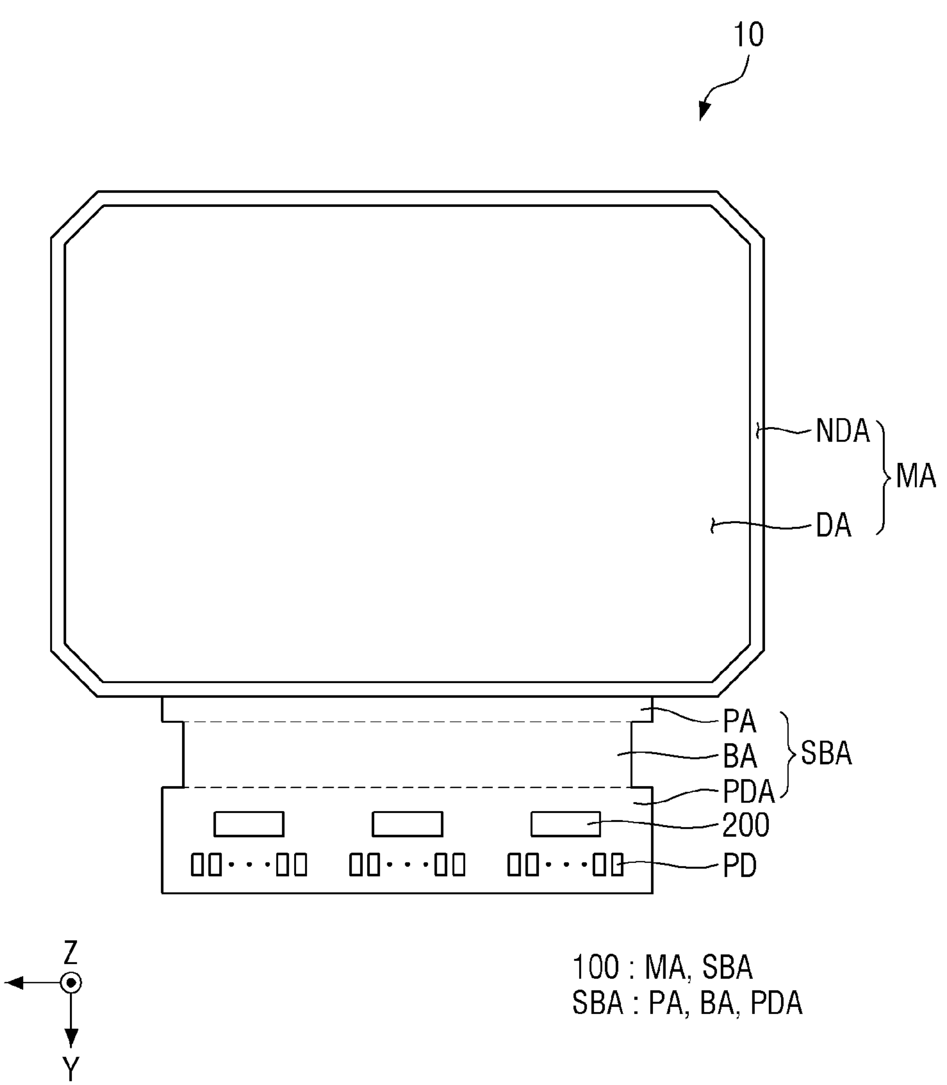
FIG. 1 is a plan view illustrating a display device according to one or more embodiments.

Aspects of some embodiments of the present disclosure and methods of accomplishing the same may be understood more readily by reference to the detailed description of embodiments and the accompanying drawings. The described embodiments are provided as examples so that this disclosure will be thorough and complete, and will fully convey the aspects of the present disclosure to those skilled in the art. Accordingly, processes, elements, and techniques that are redundant, that are unrelated or irrelevant to the description of the embodiments, or that are not necessary to those having ordinary skill in the art for a complete understanding of the aspects of the present disclosure may be omitted. Unless otherwise noted, like reference numerals, characters, or combinations thereof denote like elements throughout the attached drawings and the written description, and thus, repeated descriptions thereof may be omitted.

The described embodiments may have various modifications and may be embodied in different forms, and should not be construed as being limited to only the illustrated embodiments herein. The use of "can," "may," or "may not" in describing an embodiment corresponds to one or more embodiments of the present disclosure. The present disclosure covers all modifications, equivalents, and replacements within the idea and technical scope of the present disclosure. Further, each of the features of the various embodiments of the present disclosure may be combined with each other, in part or in whole, and technically various interlocking and driving are possible. Each embodiment may be implemented independently of each other or may be implemented together in an association.

In the drawings, the relative sizes of elements, layers, and regions may be exaggerated for clarity and/or descriptive purposes. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result of, for example, manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of elements, layers, or regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or one or more intervening layers, regions, or components may be present. The one or more intervening components may include a switch, a resistor, a capacitor, and/or the like. In describing embodiments, an expression of connection indicates electrical connection unless explicitly described to be direct connection, and "directly connected/directly coupled," or "directly on," refers to one component directly connecting or coupling another component, or being on another component, without an intermediate component.

In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to," may be construed similarly. It will be understood that when an element or layer is referred to as being "between" two elements or layers, it can be the only element or layer between the two elements or layers, or one or more intervening elements or layers may also be present.

For the purposes of this disclosure, expressions, such as "at least one of," or "any one of," or "one or more of" when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expressions "at least one of A and B" and "at least one of A or B" may include A, B, or A and B. As used herein, "or" generally means "and/or," and the term "and/or" includes any and all combinations of one or more of the associated listed items. For example, the expression "A and/or B" may include A, B, or A and B. Similarly, expressions, such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms do not correspond to a particular order, position, or superiority, and are used only used to distinguish one element, member, component, region, area, layer, section, or portion from another element, member, component, region, area, layer, section, or portion. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. For example, "substantially" may include a range of +/−5% of a corresponding value. “About” or “approximately,” as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” may mean within one or more standard deviations, or within ±30%, 20%, 10%, 5% of the stated value. Further, the use of “may” when describing embodiments of the present disclosure refers to “one or more embodiments of the present disclosure.”

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view illustrating a display device according to one or more embodiments.

Referring to FIG. 1, a display device 10 is a device that displays a moving image or a still image, and may be used as a display screen of each of various products, such as televisions, laptop computers, monitors, billboards, and Internet of Things (IoT) as well as portable electronic devices, such as mobile phones, smartphones, tablet personal computers (PCs), smartwatches, watch phones, mobile communication terminals, electronic organizers, electronic books, portable multimedia players (PMPs), navigation devices, and ultra mobile PCs (UMPCs).

The display device 10 may be a light-emitting display device, such as an organic light-emitting display device using an organic light-emitting diode, a quantum dot light-emitting display device including a quantum dot light-emitting layer, an inorganic light-emitting display device including an inorganic semiconductor, and a micro light-emitting display device using a micro or nano light-emitting diode (micro or nano LED). Hereinafter, it is mainly described that the display device 10 is the organic light-emitting display device, but the present disclosure is not limited thereto.

The display device 10 may include a display panel 100, a display-driving circuit 200, and a circuit board 300.

The display panel 100 may be formed in a rectangular plane having long sides in a first direction (X-axis direction) and short sides in a second direction (Y-axis direction) crossing the first direction (X-axis direction). A corner where the long side in the first direction (X-axis direction) and the short side in the second direction (Y-axis direction) meet may be rounded to have a curvature (e.g., predetermined curvature) or may be formed at a right angle, for example. The planar shape of the display panel 100 is not limited to the quadrangular shape, and may be other polygonal shapes, a circular shape, or an elliptical shape. The display panel 100 may be flat, but is not limited thereto. For example, the display panel 100 may include curved surface portions formed at left and right distal ends thereof and having a constant curvature or a variable curvature. In addition, the display panel 100 may be flexibly curved, bent, folded, or rolled.

The display panel 100 may include a main area MA and a sub-area SBA.

The main area MA may include a display area DA displaying an image, and a non-display area NDA that is a peripheral area of the display area DA. The display area DA may occupy most of the main area MA, and may be located in the center of the main area MA. A plurality of pixels PX may be located in the display area DA to display an image. The non-display area NDA may be located to be adjacent to the display area DA. The non-display area NDA may be an area outside the display area DA. The non-display area NDA may be located to surround the display area DA. The non-display area NDA may be an edge area of the display panel 100.

The sub-area SBA may protrude from one side of the main area MA in the second direction (Y-axis direction). A length of the sub-area SBA in the second direction (Y-axis direction) may be less than a length of the main area MA in the second direction (Y-axis direction). It is illustrated in FIG. 1 that a length of the sub-area SBA in the first direction (X-axis direction) is less than a length of the main area MA in the first direction (X-axis direction), but the present disclosure is not limited thereto. For example, the length of the sub-area SBA in the first direction (X-axis direction) may be substantially the same as the length of the main area MA in the first direction (X-axis direction).

The sub-area SBA may include a flat area PA (e.g., a first area), a bending area BA, and a pad area PDA (e.g., a second area).

The flat area PA is an area protruding from one side of the main area MA in the second direction (Y-axis direction). One side of the flat area PA may be in contact with the non-display area NDA of the main area MA, and the other side of the flat area PA may be in contact with the bending area BA. The flat area PA may be an area that is not bent when the sub-area SBA is bent.

The bending area BA may be located between the flat area PA and the pad area PDA. The sub-area SBA may be bent at the bending area BA. For example, portions the sub-area SBA bent by the bending area BA may be located at (e.g., under) a rear surface of the display panel 100. A portion of the sub-area SBA bent by the bending area BA may overlap the main area MA in a third direction (Z-axis direction). A portion of the sub-area SBA bent or folded over by the bending area BA may be the bending area BA and the pad area PDA.

The pad area PDA may be an area in which display pads PD and the display-driving circuit 200 are located.

The display-driving circuit 200 may generate signals and voltages for driving the display panel 100. The display-driving circuit 200 may be formed as an integrated circuit (IC), and may be attached onto the display panel 100 in a chip-on-glass (COG) manner, a chip-on-plastic (COP) manner, or an ultrasonic bonding manner, but is not limited thereto. For example, the display-driving circuit 200 may be attached onto the circuit board 300 in a chip-on-film (COF) manner.

A plurality of display pads PD may be located at an edge of the sub-area SBA. The display pads PD may be located at an edge on one side of the display panel 100. For example, the display pads PD may be located at an edge on a lower side of the display panel 100. The plurality of display pads PD may be connected to a graphic system through a circuit board 300 to be described later. The plurality of display pads PD may be connected to the circuit board 300 to receive digital video data, and may supply the digital video data to the display-driving circuit 200.

Figure 2:
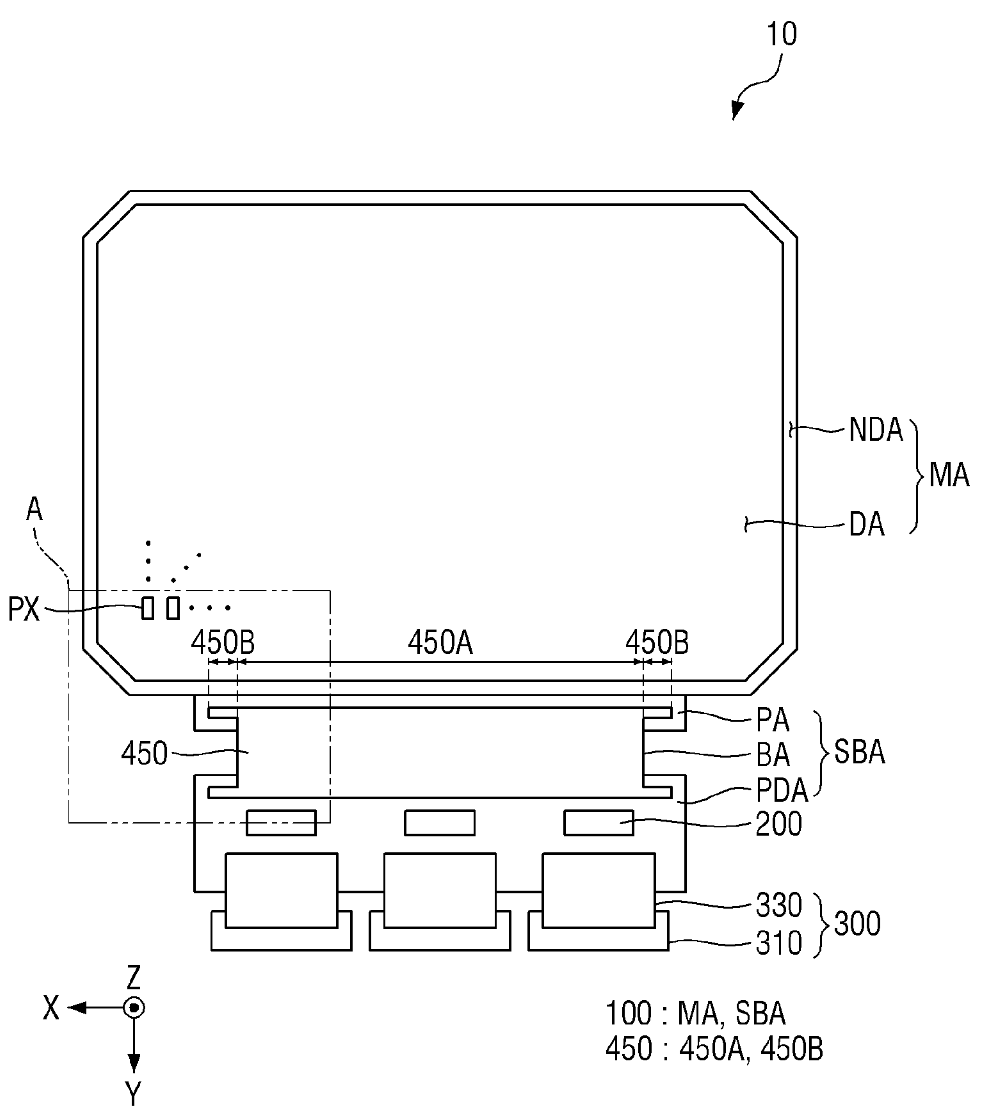
FIG. 2 is a plan view of the display device in which a circuit board is attached in FIG. 1.

FIG. 2 is a plan view of the display device 10 in which the circuit board 300 is attached in FIG. 1.

Referring to FIG. 2, the circuit board 300 may be attached to one end of the sub-area SBA of the display panel 100. Therefore, the circuit board 300 may be electrically connected to the display panel 100 and the display-driving circuit 200. The display panel 100 and the display-driving circuit 200 may receive digital video data, timing signals, and driving voltages through the circuit board 300. The circuit board 300 may include a main circuit board 310 and a flexible circuit board 330.

The main circuit board 310 may further include a plurality of electronic components mounted on the main circuit board 310. The electronic components may be electrically connected through circuit lines. The main circuit board 310 may be electrically connected to the display-driving circuit 200 through the flexible circuit board 330.

The flexible circuit board 330 may be connected to a distal end of the display panel 100 to connect the main circuit board 310 and the display-driving circuits 200. The flexible circuit board 330 may be located on the display pads PD that are located at the edge on one side of the display panel 100. The flexible circuit board 330 may be attached to the display pads PD using a conductive adhesive member, such as an anisotropic conductive film and an anisotropic conductive adhesive. Accordingly, the circuit boards 300 may be electrically connected to signal lines of the display panel 100.

A plurality of pixels PX may be positioned in the display area DA of the display panel 100. Each of the plurality of pixels PX may be defined as a minimum unit for emitting light. For example, the plurality of pixels PX may be connected by a signal line 120 to be described later. The plurality of pixels PX may be connected to the plurality of display pads PD through the signal line 120. That is, electrical signals provided from the main circuit board 310 may be connected to the display pad PD through the flexible circuit board 330, and electrical signals through the display pad PD may be provided to the pixel PX through the signal line 120.

A bending-protection layer 450 may overlap the sub-area SBA. The bending-protection layer 450 may overlap the flat area PA, the bending area BA, and the pad area PDA. The bending-protection layer 450 may be bent together with the bending area BA.

The bending-protection layer 450 may protect the bending area BA from external impact. In addition, the bending-protection layer 450 may control bending stress of a lower structure overlapping the bending area BA. For example, the bending-protection layer 450 may adjust a position of a neutral surface formed in the lower structure overlapping the bending-protection layer 450 by adjusting a thickness of the bending-protection layer 450. The neutral surface may refer to a surface where deformation does not occur when a portion of the display panel 100 is bent at a curvature (e.g., predetermined curvature), that is, a point where bending stress becomes zero.

The bending-protection layer 450 may include a synthetic resin. As an example, the bending-protection layer 450 may include at least one of acrylonitrile butadiene styrene copolymer (ABS), urethaneacrylate (UA), polyurethane (PU), polyethylene (PE), ethylene vinyl acetate (EVA), and polyvinyl chloride (PVC).

In some embodiments, the bending-protection layer 450 may include a first bending-protection layer 450A and a second bending-protection layer 450B (e.g., a first portion 450A and a second portion 450B).

The first portion 450A may overlap the flat area PA, the bending area BA, and the pad area PDA. The first portion 450A may be most of the bending-protection layer 450. The first portion 450A may completely cover the bending area BA. The second portion 450B may overlap the flat area PA and the pad area PDA. The second portion 450B may not overlap the bending area BA. The second portion 450B may be positioned at both ends of the first portion 450A in the first direction (X-axis direction). The second portion 450B may be a portion protruding from both ends of the first portion 450A.

The second portion 450B overlapping the flat area PA, and the second portion 450B overlapping the pad area PDA, may be spaced apart from each other with the bending area BA interposed therebetween. The second portion 450B overlapping the flat area PA, and the second portion 450B overlapping the pad area PDA, may be spaced apart from each other in the second direction (Y-axis direction). The second portion 450B overlapping the flat area PA, and the second portion 450B overlapping the pad area PDA, may be connected to each other by the first portion 450A.

The bending-protection layer 450 may be applied through a dispensing process. The application of the bending-protection layer 450 may start from one side with respect to the first direction X, and may proceed to the other side in the first direction X. The bending-protection layer 450 may have a non-uniform thickness in a partial section of a process starting point and a partial section of a process ending point. This may be due to the characteristics of the dispensing process. For example, the bending-protection layer 450 may have a thickness that is less than a thickness set in the partial section of the process starting point and the partial section of the process ending point. For example, the thickness of the bending-protection layer 450 of the display device 10 may be set to have a range of about 50 μm or more and about 200 μm or less. In general, when the thickness of the bending-protection layer 450 is less than the set thickness, cracks and peeling defects may occur in some structures overlapping the bending area BA. This may be caused by a change in the position of the neutral surface as the thickness of the bending-protection layer 450 is changed.

The display device 10 may include a laser process as a subsequent process of the dispensing process. The display device 10 may remove the bending-protection layer 450 having a partial non-uniform thickness on the bending area BA through the laser process. Referring to FIG. 2, a portion overlapping the second portion 450B of the bending-protection layer 450 in the second direction (Y-axis direction) on the bending area BA may be a portion from which a portion of the bending-protection layer 450 is removed through the laser process. For example, the non-uniform thickness of the bending-protection layer 450 may refer to a thickness that is outside of a range of about 50 μm or more and about 200 μm or less.

Figure 3:
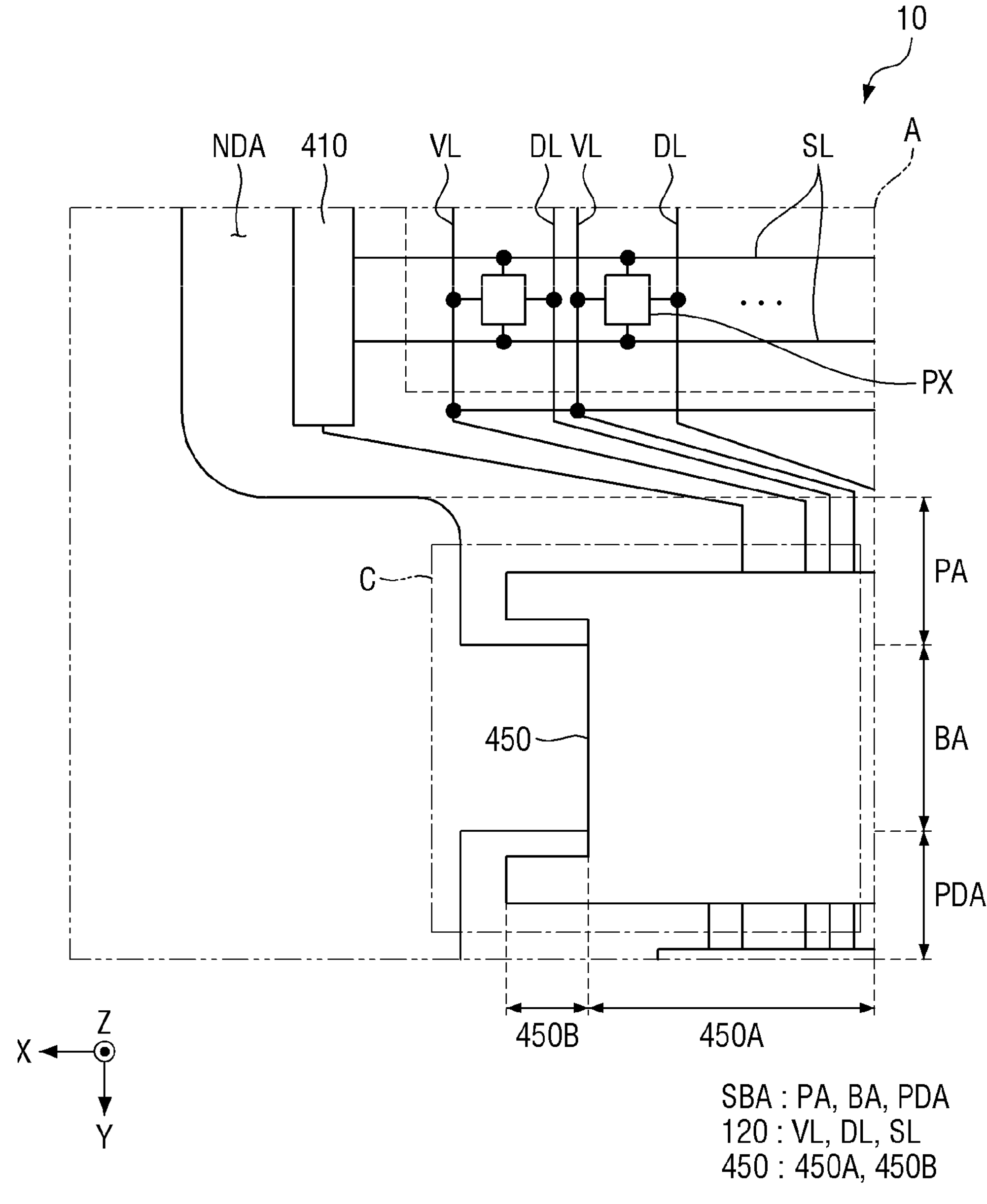
FIG. 3 is an enlarged plan view of area 'A' of FIG. 2.

FIG. 3 is an enlarged plan view of area ‘A’ of FIG. 2.

Referring to FIG. 3, each of the plurality of pixels PX may emit light by being connected to a plurality of signal lines 120. The plurality of signal lines 120 may include a scan line SL, a power line VL, and a data line DL. Each of the pixels PX may be connected to any two of the scan lines SL, any one of the power lines VL, and any one of the data lines DL. Each signal line 120 may extend to overlap the sub-area SBA, and may be finally connected to each display pad PD.

A plurality of scan lines SL may supply signals received from a scan driving controller 410 positioned in the non-display area NDA to the plurality of pixels PX. The plurality of scan lines SL may extend in the first direction (X-axis direction), and may be spaced apart from each other in the second direction (Y-axis direction) crossing the first direction (X-axis direction). The scan driving controller 410 may receive a scan timing signal from the display-driving circuit 200, generate scan signals according to the scan timing signal, and may output the scan signals to the scan lines SL.

The plurality of data lines DL may supply a data voltage received from the display-driving circuit 200 to the plurality of pixels PX. The plurality of data lines DL may extend in the second direction (Y-axis direction), and may be spaced apart from each other in the first direction (X-axis direction).

A plurality of power lines VL may supply a power voltage received from the display-driving circuit 200 to the plurality of pixels PX through a driving voltage line VSL. Here, the power voltage may be at least one of a driving voltage, an initialization voltage, a reference voltage, and a low potential voltage. The plurality of power lines VL may extend in the second direction (Y-axis direction), and may be spaced apart from each other in the first direction (X-axis direction).

A plurality of signal lines 120 may be covered by the first portion 450A of the bending-protection layer 450. The plurality of signal lines 120 overlapping the bending area BA may be protected from bending stress by the first portion 450A of the bending-protection layer 450.

Figure 4:
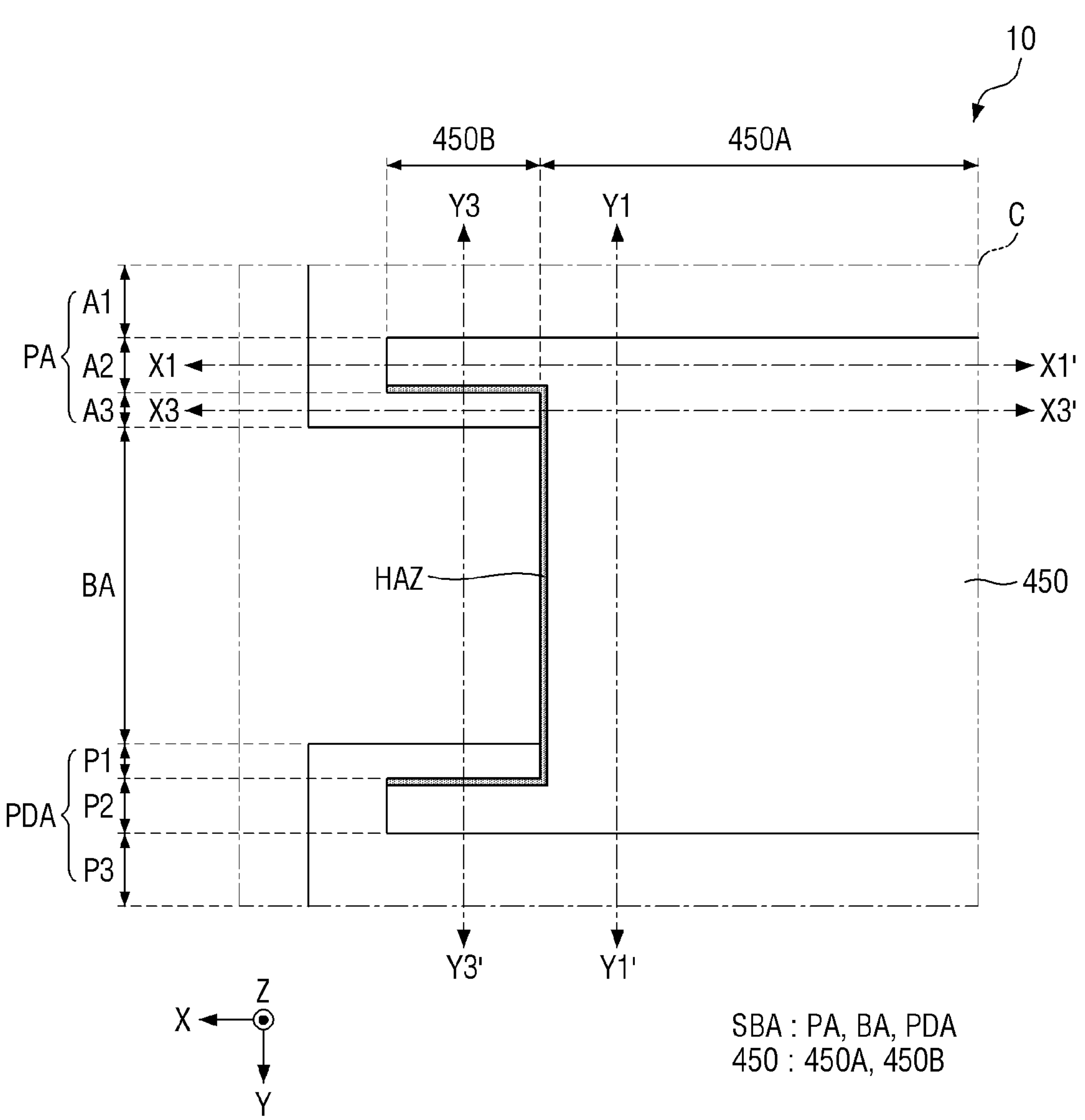
FIG. 4 is an enlarged plan view of area 'C' of FIG. 3.

FIG. 4 is an enlarged plan view of area 'C' of FIG. 3.

Referring to FIG. 4, the flat area PA may include a first area A1, a second area A2, and a third area A3. In addition, the pad area PDA may include a first area P1, a second area P2, and a third area P3.

In some embodiments, the first area A1, the second area A2, and the third area A3 of the flat area PA, and the first area P1, second area P2, and third area P3 of the pad area PDA, may be distinguished according to the configuration of the bending-protection layer 450 overlapping each portion. For example, the first area A1 of the flat area PA and the third area P3 of the pad area PDA may omit the bending-protection layer 450. In addition, the second area A2 of the flat area PA and the second area P2 of the pad area PDA may include the first portion 450A and the second portion 450B of the bending-protection layer 450. The third area A3 of the flat area PA and the first area P1 of the pad area PDA may include the first portion 450A of the bending-protection layer 450.

In some embodiments, the first area A1 of the flat area PA and the third area P3 of the pad area PDA may include (or omit) the bending-protection layer 450 having a similar structure. In addition, the second area A2 of the flat area PA and the second area P2 of the pad area PDA may include the bending-protection layer 450 having a similar structure. In addition, the third area A3 of the flat area PA and the first area P1 of the pad area PDA may include the bending-protection layer 450 having a similar structure.

As mentioned above, a portion of the bending-protection layer 450 may be removed through the laser process. Therefore, one surface of the second portion 450B of the bending-protection layer 450 overlapping the flat area PA, one surface of the first portion 450A of the bending-protection layer 450 overlapping the bending area BA, and one surface of the second portion 450B of the bending-protection layer 450 overlapping the pad area PDA may include a heat-affected zone HAZ. The heat-affected zone HAZ may be a mark where a portion of the bending-protection layer 450 is carbonized by a high-temperature laser. In other words, the heat-affected zone HAZ may be a result of the bending-protection layer 450 of the display device 10 including the laser process.

Figure 5:
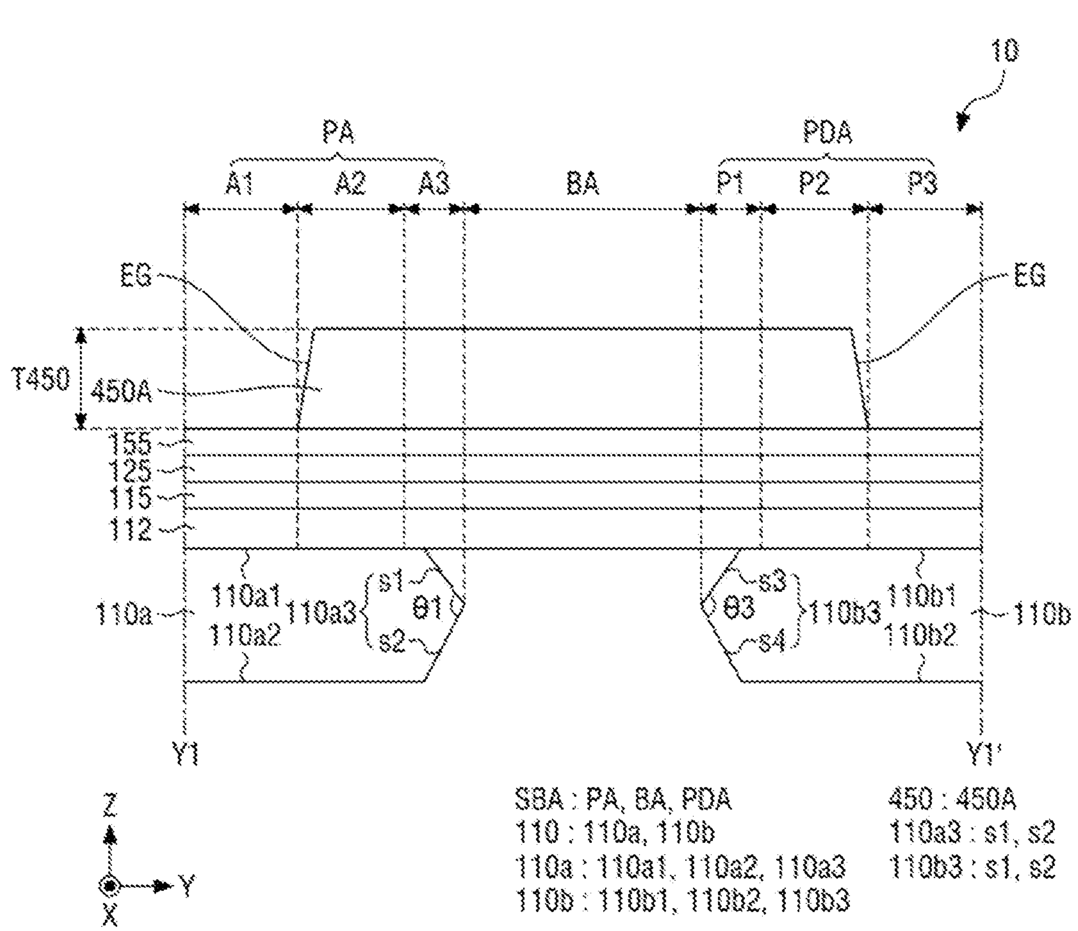
FIG. 5 is a cross-sectional view of a first bending-protection layer of a display device of FIG. 4 taken along the line Y1-Y1'.

FIG. 5 is a cross-sectional view of the display device 10 of FIG. 4 taken along the line Y1-Y1'. FIG. 5 is a cross-sectional view of the sub-area SBA overlapping the first portion 450A of the bending-protection layer 450 in the second direction (Y-axis direction).

The display device 10 may include a base substrate 110 (e.g., a first substrate), a flexible substrate 112 (e.g., a second substrate), a lower via layer 115, an upper via layer 125, a pixel definition layer 155, and a bending-protection layer 450.

Referring to FIG. 5, the base substrate 110 may be made of a light-transmitting material. For example, the base substrate 110 may be a glass substrate or a plastic substrate. The base substrate 110 may include ultra-thin glass having a thickness of about 0.02 mm or less.

In some embodiments, a portion of the base substrate 110 may be etched to secure the bending area BA, and to support the flexible substrate 112. A portion of the base substrate 110 overlapping the bending area BA may be etched during the manufacturing process. Therefore, the base substrate 110 may be divided into a first base substrate 110*a* (e.g., a first sub-substrate) and a second base substrate 110*b* (e.g., a second sub-substrate). The first base substrate 110*a* and the second base substrate 110*b* may be positioned to be spaced apart from each other with the bending area BA interposed therebetween.

In some embodiments, the first base substrate 110*a* may include an upper surface 110*a*1 facing the flexible substrate 112, a lower surface 110*a*2 opposing the upper surface 110*a*1, and a side surface 110*a*3 facing the bending area BA. The side surface 110*a*3 of the first base substrate 110*a* may include a first inclined surface s1 connected to the upper surface 110*a*1 of the first base substrate 110*a*, and a second inclined surface s2 connected to the lower surface 110*a*2 of the first base substrate 110*a*. The first inclined surface s1 and the second inclined surface s2 may be connected to each other, and the first inclined surface s1 and the second inclined surface s2 may form an inclined angle θ1. The first and second inclined surfaces s1 and s2 of the first base substrate 110*a* may be formed by an etching process of the base substrate 110.

In some embodiments, the second base substrate 110*b* may have a symmetrical structure with the first base substrate 110*a* based on the bending area BA. The second base substrate 110*b* may include an upper surface 110*b*1 facing the flexible substrate 112, a lower surface 110*b*2 opposing the upper surface 110*b*1, and a side surface 110*b*3 facing the bending area BA. The side surface 110*b*3 of the second base substrate 110*b* may include a first inclined surface s3 connected to the upper surface 110*b*1 of the second base substrate 110*b*, and a second inclined surface s4 connected to the lower surface 110*b*2 of the second base substrate 110*b*. The first inclined surface s3 and the second inclined surface s4 may be connected to each other, and the first inclined surface s3 and the second inclined surface s4 may form an inclined angle θ3. The first and second inclined surfaces s3 and s4 of the second base substrate 110*b* may be formed by an etching process of the base substrate 110.

The flexible substrate 112 may be positioned on the base substrate 110. The flexible substrate 112 may overlap the flat area PA, the bending area BA, and the pad area PDA. The flexible substrate 112 may be a flexible substrate that may be bent, folded, and rolled. That is, the flexible substrate 112 overlapping the bending area BA may be bent. The flexible substrate 112 may be made of an insulating material, such as a polymer resin. For example, the flexible substrate 112 may include polyimide.

The lower via layer 115 may be positioned on the flexible substrate 112. The lower via layer 115 may overlap the flat area PA, the bending area BA, and the pad area PDA. That is, the lower via layer 115 overlapping the bending area BA may be bent. The lower via layer 115 may be an organic material having a planarization function. For example, the lower via layer 115 and the upper via layer 125 may include an acryl resin, an epoxy resin, a phenolic resin, a polyamide resin, a polyimide resin, or the like.

The upper via layer 125 may be positioned on the lower via layer 115. The upper via layer 125 may overlap the flat area PA, the bending area BA, and the pad area PDA. That is, the upper via layer 125 overlapping the bending area BA may be bent. The upper via layer 125 may be an organic material having a planarization function. The upper via layer 125 may include the same material as the lower via layer 115.

In one or more embodiments, the signal line 120 may be positioned between the lower via layer 115 and the upper via layer 125. The signal line 120 may include all signal lines suitable for the pixel PX to emit light.

The pixel definition layer 155 may be positioned on the upper via layer 125. The pixel definition layer 155 may overlap the flat area PA, the bending area BA, and the pad area PDA. That is, the pixel definition layer 155 overlapping the bending area BA may be bent. The pixel definition layer 155 may serve to define a light-emitting area in the display area DA. The pixel definition layer 155 may be formed as an organic film made of an acryl resin, an epoxy resin, a phenolic resin, a polyamide resin, a polyimide resin, or the like.

The bending-protection layer 450 may be positioned on the pixel definition layer 155. The bending-protection layer 450 illustrated in FIG. 5 may be the first portion 450A. The first portion 450A of the bending-protection layer 450 may overlap the second and third areas A2 and A3 of the flat area PA, and the first and second areas P1 and P2 of the pad area PDA.

In some embodiments, the first portion 450A of the bending-protection layer 450 may overlap the third area A3 of the flat area PA, the bending area BA, and the first area P1 of the pad area PDA to have a substantially uniform thickness T450. In this specification, the meaning of the substantially uniform thickness T450 may correspond to a range of about 50 μm or more and about 200 μm or less.

Therefore, in the lower structure overlapping the bending area BA and the first portion 450A of the bending-protection layer 450, bending stress may be reduced by the bending-protection layer 450. As a result, in the lower structure overlapping the first portion 450A of the bending-protection layer 450 and the bending area BA, the risk of cracking and peeling may be reduced. As an example, the lower structure overlapping the bending area BA and the first portion 450A of the bending-protection layer 450 may include all of the flexible substrate 112, the lower via layer 115, the upper via layer 125, the signal line 120, and the pixel definition layer 155.

In some embodiments, the bending-protection layer 450 may include an edge portion EG overlapping the second area A2 of the flat area PA and the second area P2 of the pad area PDA. The edge portion EG is not formed by a separate process, and may be an edge portion formed after the bending-protection layer 450 is applied.

Figure 6:
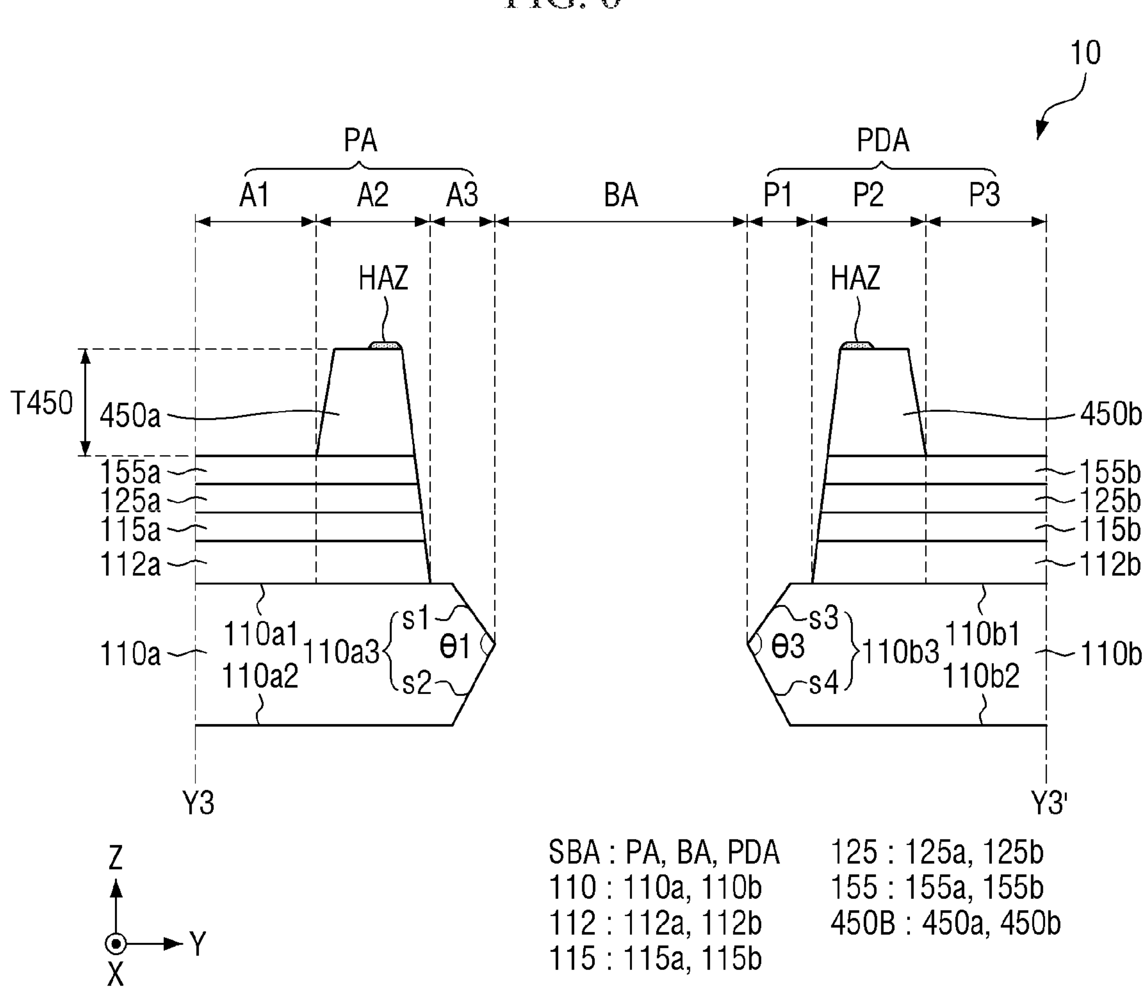
FIG. 6 is a cross-sectional view of a second bending-protection layer of the display device of FIG. 4 taken along the line Y3-Y3'.

FIG. 6 is a cross-sectional view of the display device 10 of FIG. 4 taken along the line Y3-Y3'. FIG. 6 is a cross-sectional view of the sub-area SBA overlapping the second portion 450B of the bending-protection layer 450 in the second direction (Y-axis direction).

Referring to FIG. 6, the display device 10 may include a base substrate 110, a flexible substrate 112, a lower via layer 115, an upper via layer 125, a pixel definition layer 155, and a bending-protection layer 450. The bending-protection layer 450 illustrated in FIG. 6 may be the second portion 450B.

In the display device 10, a portion of the bending-protection layer 450 may be removed through a laser process. For example, a portion of the second portion 450B of the bending-protection layer 450 overlapping the bending area BA may be removed. This may be a process performed to prevent the bending-protection layer 450 including a non-uniform thickness T450 from overlapping the bending area BA. In this specification, the meaning of the non-uniform thickness T450 may have a range of about 50 μm or more and about 200 μm or less.

In one or more embodiments, the laser process may remove the bending-protection layer 450 overlapping the bending area BA and the second portion 450B of the bending-protection layer 450, and may also remove a lower structure overlapping therewith. In other words, the flexible substrate 112, the lower via layer 115, the upper via layer 125, and the pixel definition layer 155 overlapping the second portion 450B of the bending-protection layer 450 and the bending area BA may also be removed. Therefore, the second portion 450B of the bending-protection layer 450 may be divided into a first sub-portion 450*a* and a second sub-portion 450*b* (not to be confused with the first portion 450A and the second portion 450B), and the first sub-portion 450*a* and the second sub-portion 450*b* may be spaced apart from each other with the bending area BA interposed therebetween. One surface of the first sub-portion 450*a* and one surface of the second sub-portion 450*b* of the bending-protection layer 450 may include a heat-affected zone HAZ formed by a high-temperature laser.

In addition, the flexible substrate 112 may be divided into a first flexible substrate 112*a* and a second flexible substrate 112*b*. The first flexible substrate 112*a* and the second flexible substrate 112*b* may be spaced apart from each other with the bending area BA interposed therebetween. The lower via layer 115 may be divided into a first lower via layer 115*a* and a second lower via layer 115*b*, and the first lower via layer 115*a* and the second lower via layer 115*b* may be spaced apart from each other with the bending area BA interposed therebetween. The upper via layer 125 may be divided into a first upper via layer 125*a* and a second upper via layer 125*b*, and the first upper via layer 125*a* and the second upper via layer 125*b* may be spaced apart from each other with the bending area BA interposed therebetween. The pixel definition layer 155 may be divided into a first pixel definition layer 155*a* and a second pixel definition layer 155*b*, and the first pixel definition layer 155*a* and the second pixel definition layer 155*b* may be spaced apart from each other with the bending area BA interposed therebetween.

In some embodiments, the high-temperature laser included in the laser process may affect up to the third area A3 of the flat area PA, and up to the first area P1 of the pad area PDA, which are adjacent to the bending area BA. In other words, even when the laser is irradiated to the bending area BA as a target, the laser may affect the third area A3 of the flat area PA and the first area P1 of the pad area PDA. Therefore, the bending-protection layer 450 and lower structures positioned in the third area A3 of the flat area PA and the first area P1 of the pad area PDA may also be removed by the laser process. For example, a width of the third area A3 of the flat area PA and a width of the first area P1 of the pad area PDA affected by the high-temperature laser may have a range of about 60 μm or more and about 300 μm or less.

In some embodiments, the first area A1 of the flat area PA and the third area P3 of the pad area PDA may include the base substrate 110, the flexible substrate 112, the lower via layer 115, the upper via layer 125, and the pixel definition layer 155. In other words, the first area A1 of the flat area PA and the third area P3 of the pad area PDA may be an area that does not include the bending-protection layer 450.

In some embodiments, the second area A2 of the flat area PA and the second area P2 of the pad area PDA may include the base substrate 110, the flexible substrate 112, the lower via layer 115, the upper via layer 125, the pixel definition layer 155, and may also include the bending-protection layer 450.

In some embodiments, the third area A3 of the flat area PA and the first area P1 of the pad area PDA may include only the base substrate 110. In other words, the base substrate 110, the flexible substrate 112, the lower via layer 115, the upper via layer 125, the pixel definition layer 155, and the bending-protection layer 450 overlapping the third area A3 of the flat area PA and the first area P1 of the pad area PDA may be removed through the laser process.

Figure 7:
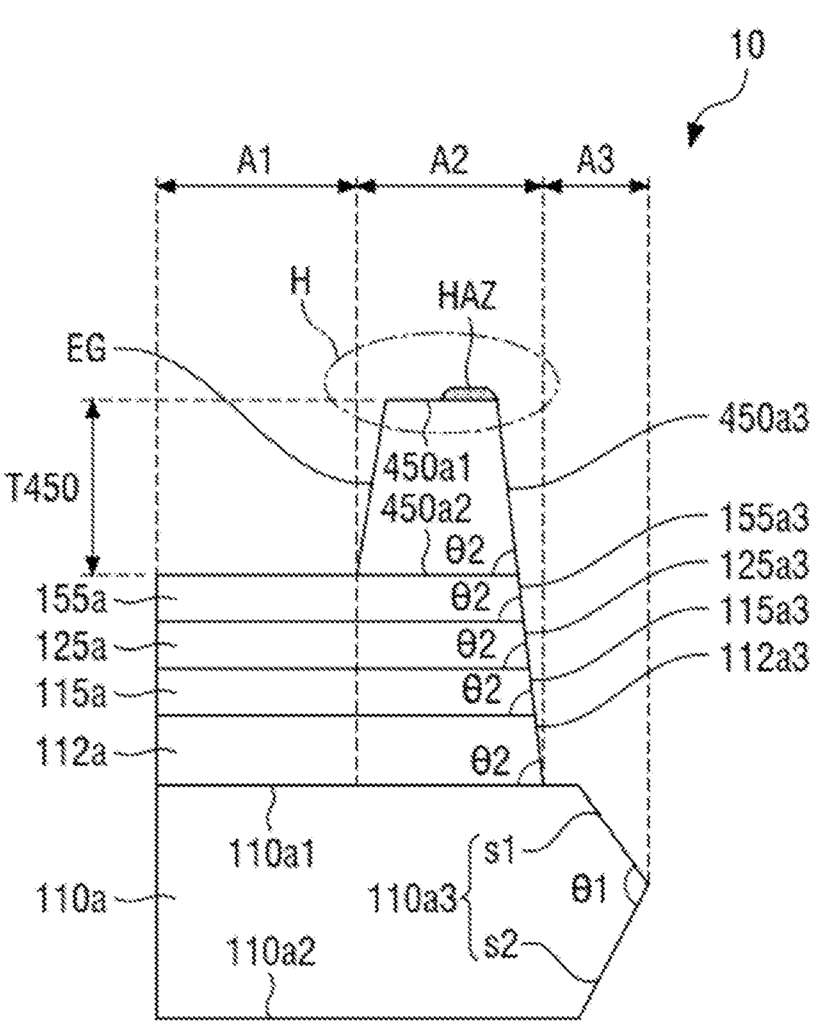
FIG. 7 is an enlarged cross-sectional view of a flat area of a display device of FIG. 6.
Figure 7:
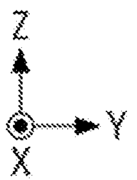

FIG. 7 is an enlarged cross-sectional view of the flat area PA of the display device 10 of FIG. 6.

A cross-sectional structure overlapping the second area A2 of the flat area PA will be described with reference to FIG. 7.

In some embodiments, the first flexible substrate **112*a* may be positioned on the first base substrate 110*a*. The first flexible substrate 112*a* may include a side surface 112*a*3 of the first flexible substrate 112*a* in a direction toward the third area A3. The side surface 112*a*3 of the first flexible substrate 112*a* may be an inclined surface. The upper surface 110*a*1 of the first base substrate 110*a* and the side surface 112*a*3 of the first flexible substrate 112*a* may form an inclined angle θ2. As an example, the inclined angle 62 may be an acute angle, and the inclined angle 62 may be about 60° or more and about 90° or less. The side surface 112*a*3 of the first flexible substrate 112*a*** may be formed by a laser process.

The first lower via layer **115*a* may be positioned on the first flexible substrate 112*a*. The first lower via layer 115*a* may include a side surface 115*a*3 of the first lower via layer 115*a* in a direction toward the third area A3. The side surface 115*a*3 of the first lower via layer 115*a* may be an inclined surface. One surface of the first flexible substrate 112*a* and the side surface 115*a*3 of the first lower via layer 115*a* may form an inclined angle θ2. The inclined angle 62 may be an acute angle, and for example, the inclined angle 62** may be about 60+θ or more and about 90° or less.

The first upper via layer **125*a* may be positioned on the first lower via layer 115*a*. The first upper via layer 125*a* may include a side surface 125*a*3 of the first upper via layer 125*a* in a direction toward the third area A3. The side surface 125*a*3 of the first upper via layer 125*a* may be an inclined surface. One surface of the first lower via layer 115*a* and the side surface 125*a*3 of the first upper via layer 125*a* may form an inclined angle θ2. The inclined angle 62 may be an acute angle, and for example, the inclined angle 62** may be about 60° or more and about 90° or less.

The first pixel definition layer **155*a* may be positioned on the first upper via layer 125*a*. The first pixel definition layer 155*a* may include a side surface 155*a*3 of the first pixel definition layer 155*a* in a direction toward the third area A3. The side surface 155*a*3 of the first pixel definition layer 155*a* may be an inclined surface. One surface of the first upper via layer 125*a* and the side surface 155*a*3 of the first pixel definition layer 155*a* may form an inclined angle θ2. The inclined angle 62 may be an acute angle, and for example, the inclined angle 62** may be about 60° or more and about 90° or less.

The first sub-portion **450*a* of the bending-protection layer 450 may be positioned on the first pixel definition layer 155*a*. The first sub-portion 450*a* of the bending-protection layer 450 may include a lower surface 450*a*2 facing the first pixel definition layer 155*a*, and an upper surface 450*a*1 opposite from the lower surface 450*a*2. In addition, the first sub-portion 450*a* may include a side surface 450*a*3 of the first sub-portion 450*a* in a direction toward the third area A3. The side surface 450*a*3 of the first sub-portion 450*a* may be an inclined surface. One surface of the first pixel definition layer 155*a* and the side surface 450*a*3 of the first sub-portion 450*a* may form an inclined angle θ2. The inclined angle 62 may be an acute angle, and for example, the inclined angle 62** may be about 60° or more and about 90° or less.

In some embodiments, the side surface **112*a*3 of the first flexible substrate 112*a*, the side surface 115*a*3 of the first lower via layer 115*a*, the side surface 125*a*3 of the first upper via layer 125*a*, the side surface 155*a*3 of the first pixel definition layer 155*a*, and the side surface 450*a*3 of the first sub-portion 450*a* of the bending-protection layer 450 may be formed through the same laser process. That is, the side surface 112*a*3 of the first flexible substrate 112*a*, the side surface 115*a*3 of the first lower via layer 115*a*, the side surface 125*a*3 of the first upper via layer 125*a*, the side surface 155*a*3 of the first pixel definition layer 155*a*, and the side surface 450*a*3 of the first sub-portion 450*a* of the bending-protection layer 450 may be concurrently or substantially simultaneously formed. Each of the side surface 112*a*3 of the first flexible substrate 112*a*, the side surface 115*a*3 of the first lower via layer 115*a*, the side surface 125*a*3 of the first upper via layer 125*a*, the side surface 155*a*3 of the first pixel definition layer 155*a*, and the side surface 450*a*3 of the first sub-portion 450*a* of the bending-protection layer 450** may be aligned with each other and extend in a substantially straight line.

The first sub-portion **450*a* of the bending-protection layer 450 may include an edge portion EG. A thickness T450 of the bending-protection layer 450 overlapping the edge portion EG may have a value of less than about 50 μm. In general, because the second area A2 of the flat area PA and the second area P2 of the pad area PDA are spaced apart from the bending area BA and are not bent, cracks and peeling defects of the lower structure may not be caused even if the thickness T450 of the bending-protection layer 450** does not have a range of about 50 μm or more and about 200 μm or less.

Figure 8:
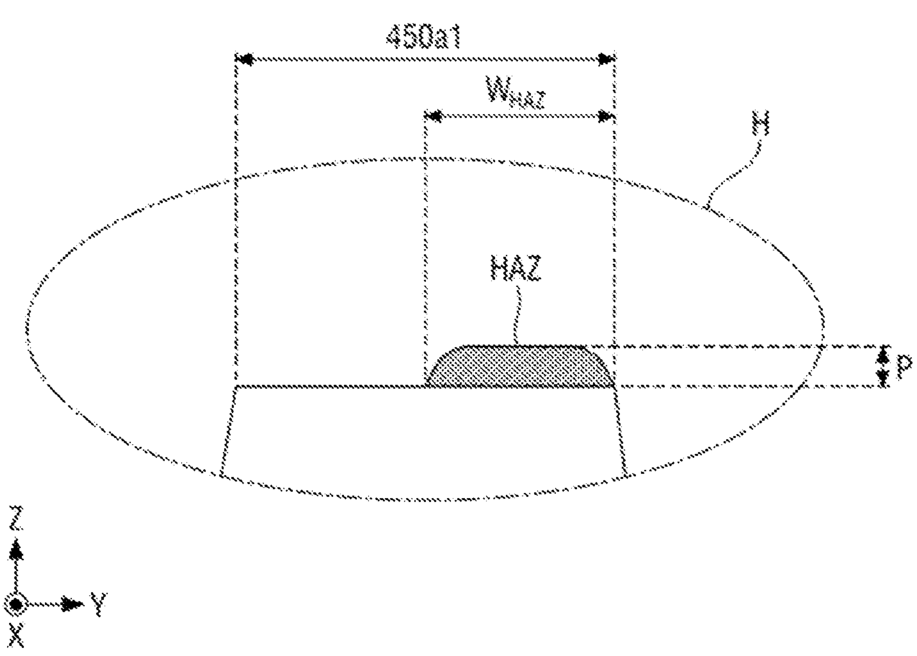
FIGS. 8 and 9 are enlarged cross-sectional views of 'H' area of FIG. 7.
Figure 9:
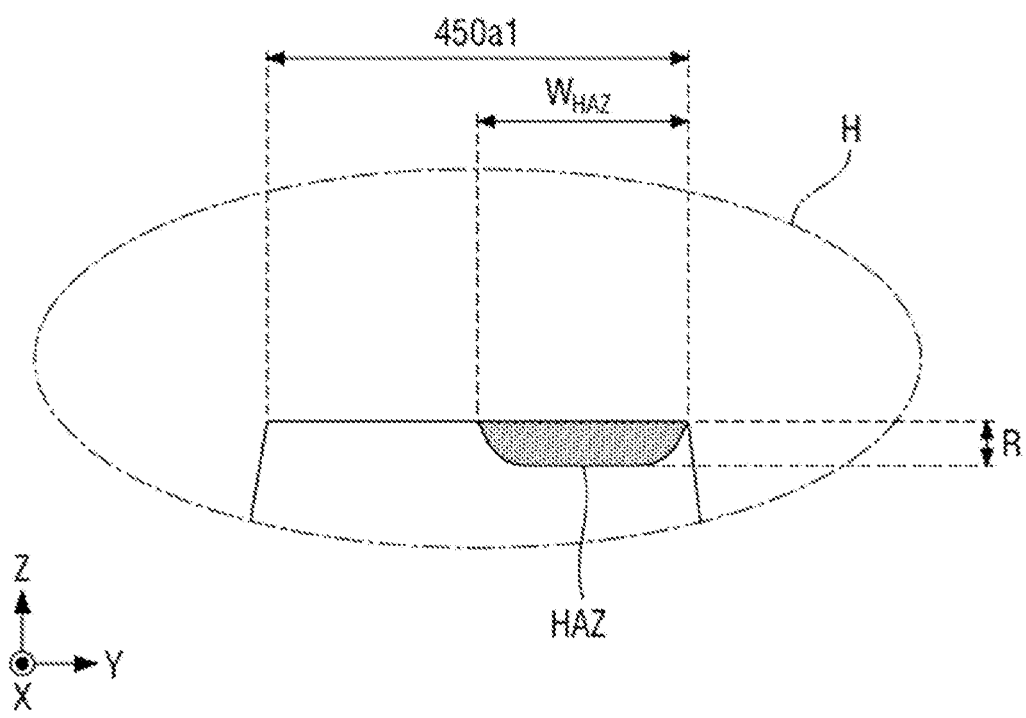

FIGS. 8 and 9 are enlarged cross-sectional views of 'H' area of FIG. 7.

Referring to FIGS. 7 to 9, the upper surface **450*a*1 of the first sub-portion 450*a* of the bending-protection layer 450 may include a heat-affected zone HAZ formed by a high-temperature laser. The heat-affected zone HAZ may be a mark in which a portion of the upper surface 450*a*1 of the first sub-portion 450*a* is carbonized by the high-temperature laser. Therefore, the heat-affected zone HAZ may be positioned in a portion of the upper surface 450*a*1 of the first sub-portion 450*a*** close to the bending area BA.

A shape of the heat-affected zone HAZ may also protrude (P) with respect to the upper surface **450*a*1 of the first sub-portion 450*a* as illustrated in FIG. 8, and, as illustrated in FIG. 9, may also be recessed (R) with respect to the upper surface 450*a*1 of the first sub-portion 450*a*. However, the shape of the heat-affected zone HAZ may include any shape in which a resin is carbonized by high temperature without being limited thereto. For example, the shape of the heat-affected zone HAZ may include all of a burnt shape, a wrinkled shape, and an embossed shape. For example, a width $W_{HAZ}$ of the heat-affected zone HAZ may be about 10 μm or more and about 100 μm or less. The width $W_{HAZ}$ of the heat-affected zone HAZ may vary depending on the material of the bending-protection layer 450**.

Figure 10:
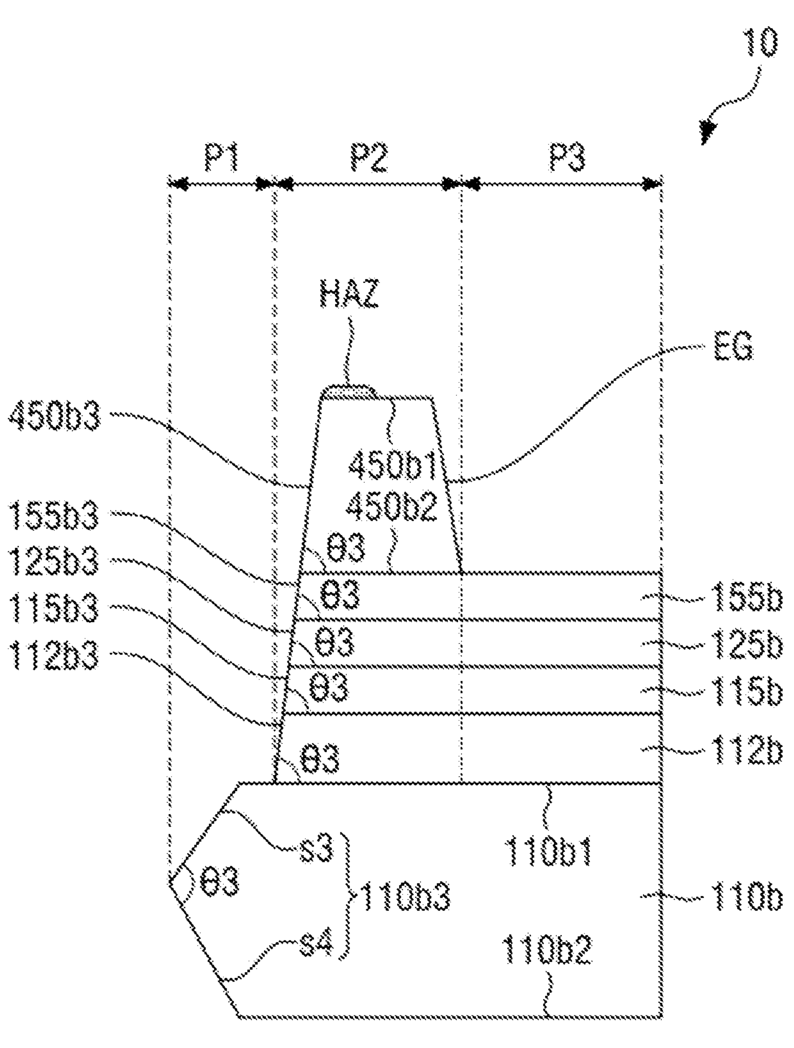
FIG. 10 is an enlarged cross-sectional view of a pad area of the display device of FIG. 6.
Figure 10:
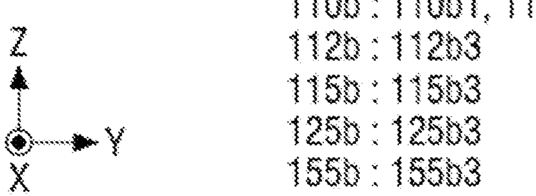

FIG. 10 is an enlarged cross-sectional view of a pad area of the display device of FIG. 6.

A cross-sectional structure overlapping the second area P2 of the pad area PDA will be described with reference to FIG. 10.

The second flexible substrate 112*b* may be positioned on the second base substrate 110*b*. The second flexible substrate 112*b* may be spaced apart from the first flexible substrate 112*a* with the bending area BA interposed therebetween. The second flexible substrate 112*b* may include a side surface 112*b*3 of the second flexible substrate 112*b* in a direction toward the first area P1. The side surface 112*b*3 of the second flexible substrate 112*b* may be an inclined surface. The upper surface 110*b*1 of the second base substrate 110*b* and the side surface 112*b*3 of the second flexible substrate 112*b* may form an inclined angle θ3. As an example, the inclined angle θ3 may be an acute angle, and the inclined angle θ3 may be about 60° or more and about 90° or less. The side surface 112*b*3 of the second flexible substrate 112*b* may be formed through a laser process.

The second lower via layer 115*b* may be positioned on the second flexible substrate 112*b*. The second lower via layer 115*b* may be spaced apart from the first lower via layer 115*a* with the bending area BA interposed therebetween. The second lower via layer 115*b* may include a side surface 115*b*3 of the second lower via layer 115*b* in a direction toward the first area P1. The side surface 115*b*3 of the second lower via layer 115*b* may be an inclined surface. One surface of the second flexible substrate 112*b* and the side surface 115*b*3 of the second lower via layer 115*b* may form an inclined angle θ3. As an example, the inclined angle θ3 may be an acute angle, and the inclined angle θ3 may be about 60° or more and about 90° or less. The side surface 115*b*3 of the second lower via layer 115*b* may be formed through a laser process.

The second upper via layer 125*b* may be positioned on the second lower via layer 115*b*. The second upper via layer 125*b* may be spaced apart from the first upper via layer 125*a* with the bending area BA interposed therebetween. The second upper via layer 125*b* may include a side surface 125*b*3 of the second upper via layer 125*b* in a direction toward the first area P1. The side surface 125*b*3 of the second upper via layer 125*b* may be an inclined surface. One surface of the second lower via layer 115*b* and the side surface 125*b*3 of the second upper via layer 125*b* may form an inclined angle θ3. As an example, the inclined angle θ3 may be an acute angle, and the inclined angle θ3 may be about 60° or more and about 90+θ or less. The side surface 125*b*3 of the second upper via layer 125*b* may be formed through a laser process.

The second pixel definition layer 155*b* may be positioned on the second upper via layer 125*b*. The second pixel definition layer 155*b* may be spaced apart from the first pixel definition layer 155*a* with the bending area BA interposed therebetween. The second pixel definition layer 155*b* may include a side surface 155*b*3 of the second pixel definition layer 155*b* in a direction toward the first area P1. The side surface 155*b*3 of the second pixel definition layer 155*b* may be an inclined surface. One surface of the second upper via layer 125*b* and the side surface 155*b*3 of the second pixel definition layer 155*b* may form an inclined angle θ3. As an example, the inclined angle θ3 may be an acute angle, and the inclined angle θ3 may be about 60° or more and about 90° or less. The side surface 155*b*3 of the second pixel definition layer 155*b* may be formed through a laser process.

The second sub-portion 450*b* of the bending-protection layer 450 may be positioned on the second pixel definition layer 155*b*. The second sub-portion 450*b* of the bending-protection layer 450 may include a lower surface 450*b*2 facing the second pixel definition layer 155*b* and an upper surface 450*b*1 opposite to the lower surface 450*b*2. In addition, the second sub-portion 450*b* may include a side surface 450*b*3 of the second sub-portion 450*b* in a direction toward the first area P1. The side surface 450*b*3 of the second sub-portion 450*b* may be an inclined surface. One surface of the second pixel definition layer 155*b* and the side surface 450*b*3 of the second sub-portion 450*b* may form an inclined angle θ3. The inclined angle θ3 may be an acute angle, and for example, the inclined angle θ3 may be about 60° or more and about 90° or less.

In some embodiments, the side surface 112*b*3 of the second flexible substrate 112*b*, the side surface 115*b*3 of the second lower via layer 115*b*, the side surface 125*b*3 of the first upper via layer 125*b*, the side surface 155*b*3 of the second pixel definition layer 155*b*, and the side surface 450*b*3 of the second sub-portion 450*b* of the bending-protection layer 450 may be formed through the same laser process. That is, the side surface 112*b*3 of the second flexible substrate 112*b*, the side surface 115*b*3 of the second lower via layer 115*b*, the side surface 125*b*3 of the first upper via layer 125*b*, the side surface 155*b*3 of the second pixel definition layer 155*b*, and the side surface 450*b*3 of the second sub-portion 450*b* of the bending-protection layer 450 may be concurrently or substantially simultaneously formed. Each of the side surface 112*b*3 of the second flexible substrate 112*b*, the side surface 115*b*3 of the second lower via layer 115*b*, the side surface 125*b*3 of the first upper via layer 125*b*, the side surface 155*b*3 of the second pixel definition layer 155*b*, and the side surface 450*b*3 of the second sub-portion 450*b* of the bending-protection layer 450 may be aligned with each other, and may extend in a substantially straight line.

The second sub-portion 450*b* of the bending-protection layer 450 may include an edge portion EG opposing the side surface 450*b*3 of the second sub-portion 450*b*. An overlapping description will be omitted.

Figure 11:
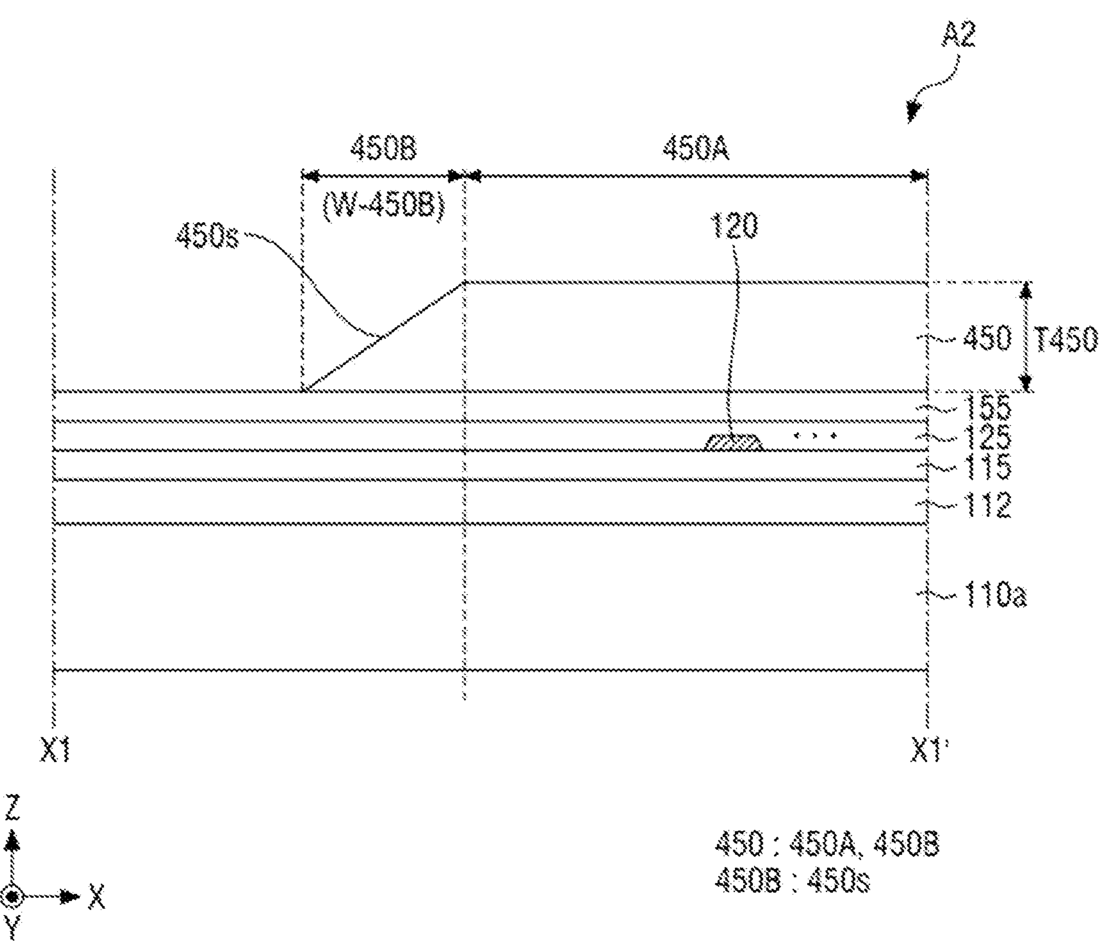
FIG. 11 is a cross-sectional view of a sub-area of the display device of FIG. 4 taken along the line X1-X1'.

FIG. 11 is a cross-sectional view of a sub-area SBA of the display device 10 of FIG. 4 taken along the line X1-X1'.

Referring to FIG. 11, the bending-protection layer 450 overlapping the second area A2 of the flat area PA in the first direction (X-axis direction) may include a first portion 450A and a second portion 450B.

In some embodiments, the first portion 450A of the bending-protection layer 450 may include a substantially uniform thickness T450. In a lower structure overlapping the first portion 450A, bending stress may be reduced by the bending-protection layer 450. For example, the lower structure may include all of the base substrate 110, the flexible substrate 112, the signal line 120, the via layers 115 and 125, and the pixel definition layer 155.

The second portion 450B of the bending-protection layer 450 may include a non-uniform thickness T450, or may have a thickness that is different than the thickness of the first portion 450A. That is, the second portion 450B of the bending-protection layer 450 may have a thickness outside the range of the substantially uniform thickness T450. In other words, the thickness T450 of the second portion 450B of the bending-protection layer 450 may be less than about 50 μm or about 200 μm or more.

In some embodiments, the thickness T450 of the second portion 450B may increase in a direction toward the first portion 450A. Therefore, the second portion 450B of the bending-protection layer 450 may include an inclined surface 450*s*. For convenience of explanation, it is illustrated and then described that the second portion 450B includes the inclined surface 450*s* whose thickness T450 includes the range of less than about 50 μm, which may decrease substantially uniformly, but the present disclosure is not limited thereto. That is, the thickness T450 of the second portion 450B of the bending-protection layer 450 may include an embossed shape including a portion of less than about 50 μm and a portion of about 200 μm or more at the same time.

As mentioned above, the second portion 450B of the bending-protection layer 450 may be caused because the bending-protection layer 450 includes the dispenser process. That is, the second portion 450B of the bending-protection layer 450 may be a portion of a starting point or a portion of an ending point of an application process. For example, a width W-450B of the second portion 450B of the bending-protection layer 450 may have a range of about 0.9 mm or more and about 1 mm or less. The detailed description thereof has already been mentioned above, and will be thus omitted.

Figure 12:
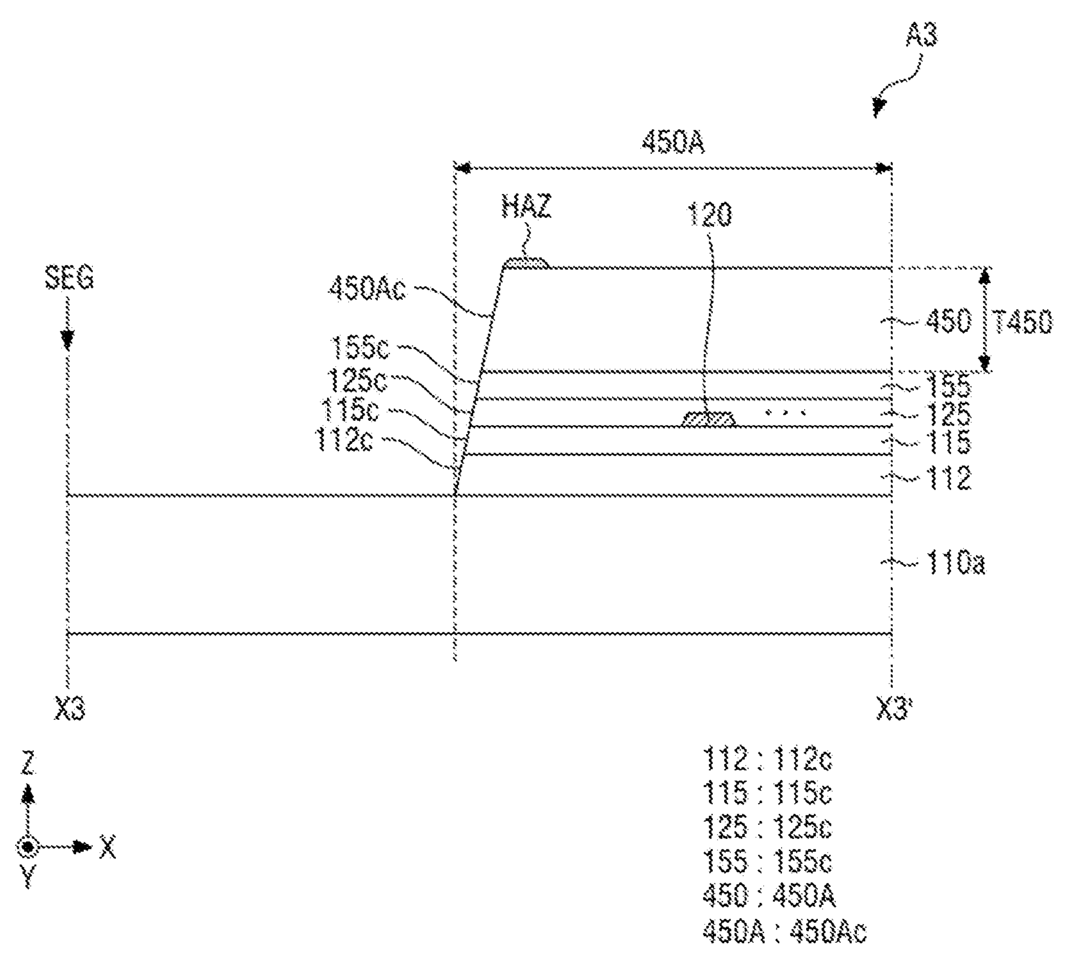
FIG. 12 is a cross-sectional view of a sub-area of the display device of FIG. 4 taken along the line X3-X3'.

FIG. 12 is a cross-sectional view of a sub-area SBA of the display device 10 of FIG. 4 taken along the line X3-X3'.

Referring to FIG. 12, the bending-protection layer 450 may overlap the third area A3 of the flat area PA in the first direction (X-axis direction), and may include the first portion 450A. In other words, the third area A3 of the flat area PA may omit the second portion 450B of the bending-protection layer 450.

In some embodiments, the first portion 450A of the bending-protection layer 450 may include a heat-affected zone HAZ formed by a laser process in a direction toward a distal end SEG of the first base substrate 110*a*. In addition, the first portion 450A of the bending-protection layer 450 may include a side surface 450Ac inclined in the direction toward the distal end SEG of the first base substrate 110*a*. The heat-affected zone HAZ and the side surface 450Ac included in the first portion 450A of the bending-protection layer 450 may be formed by a laser process. In other words, the heat-affected zone HAZ and the side surface 450Ac included in the first portion 450A of the bending-protection layer 450 may mean that a portion of the bending-protection layer 450 is removed between the distal end SEG of the first base substrate 110*a* and the first portion 450A of the bending-protection layer 450.

In some embodiments, the flexible substrate 112 may overlap the third area A3 of the flat area PA, and may include a side surface 112*c* inclined in a direction toward the distal end SEG of the first base substrate 110*a*, and also may include the lower via layer 115 may include a side surface 115*c* inclined in the direction toward the distal end SEG of the first base substrate 110*a*. In addition, the upper via layer 125 may overlap the third area A3 of the flat area PA, and may include a side surface 125*c* inclined in the direction toward the distal end SEG of the first base substrate 110*a*, and the pixel definition layer 155 may include a side surface 155*c* inclined in the direction toward the distal end SEG of the first base substrate 110*a*.

In some embodiments, the side surface 112*c* of the flexible substrate 112, the side surface 115*c* of the lower via layer 115, the side surface 125*c* of the upper via layer 125, the side surface 155*c* of the pixel definition layer 155, and the side surface 450Ac of the first portion 450A of the bending-protection layer 450 may be formed by the same laser process to overlap the third area A3 of the flat area PA. Therefore, each of the side surface 112*c* of the flexible substrate 112, the side surface 115*c* of the lower via layer 115, the side surface 125*c* of the upper via layer 125, the side surface 155*c* of the pixel definition layer 155, and the side surface 450Ac of the first portion 450A of the bending-protection layer 450 may be aligned with each other and extend to overlap the third area A3 of the flat area PA.

Figure 13:
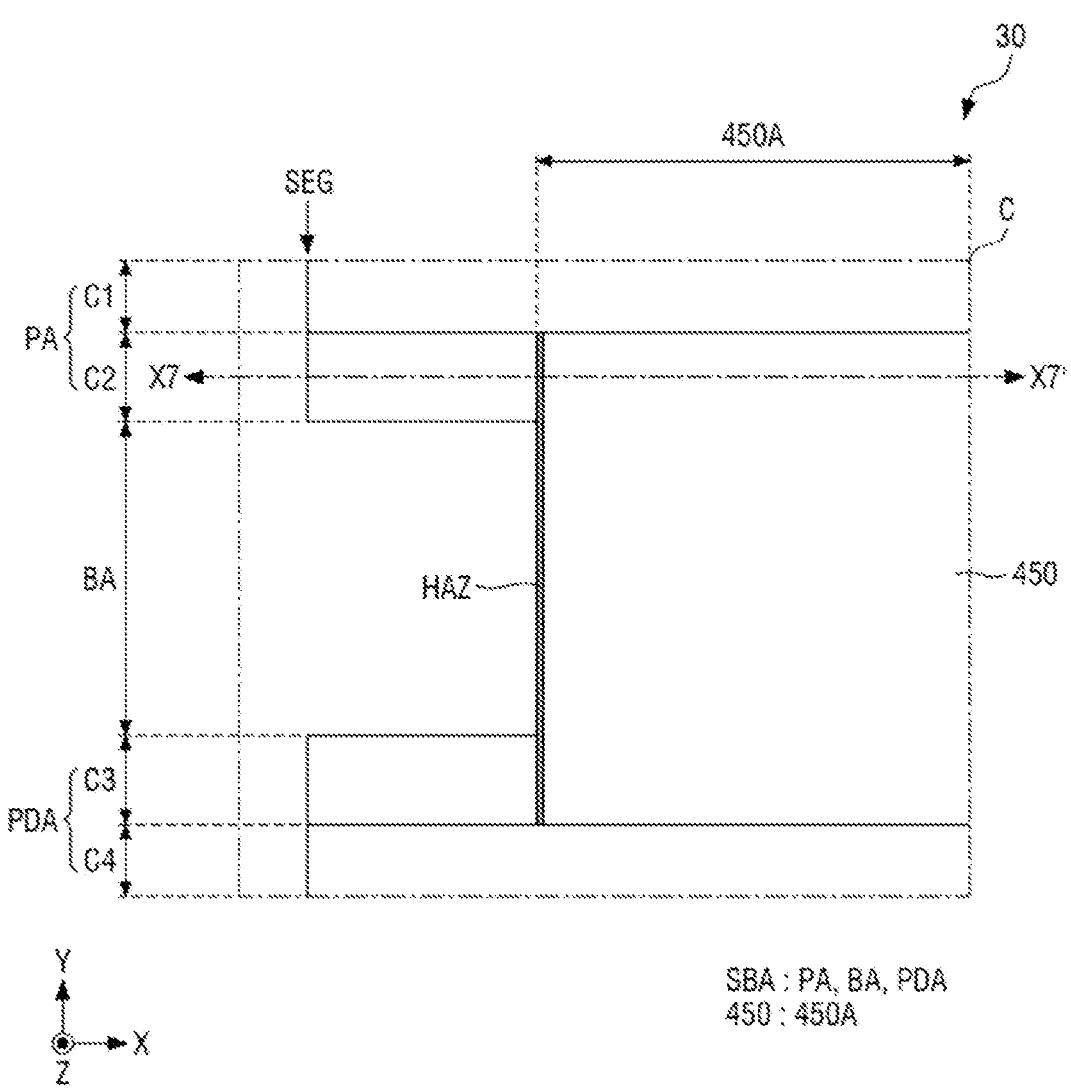
FIG. 13 is an enlarged plan view of area 'C' of FIG. 5 according to one or more other embodiments.

FIG. 13 is an enlarged plan view of area 'C' of FIG. 5 according to one or more other embodiments.

Referring to FIG. 13, a flat area PA of a display device 30 may include a first area C1 and a second area C2, and a pad area PDA of the display device 30 may include a first area C3 and a second area C4. The first and second areas C1 and C2 of the flat area PA and the first and second areas C3 and C4 of the pad area PDA may be divided according to the configuration of the bending-protection layer 450.

In some embodiments, the first area C1 of the flat area PA and the second area C4 of the pad area PDA of the display device 30 may omit the bending-protection layer 450. In addition, the second area C2 of the flat area PA and the first area C3 of the pad area PDA may include the bending-protection layer 450. For example, the bending-protection layer 450 of the display device 30 may include the first portion 450A and the second portion 450B of the bending-protection layer 450 after (e.g., immediately after) application by the dispenser. However, in the bending-protection layer 450 of the display device 30, the entire second portion 450B of the bending-protection layer 450 may be removed through a subsequent laser process. Therefore, only the first portion 450A of the bending-protection layer 450 of the display device 30 may remain as a result.

In some embodiments, the bending-protection layer 450 of the display device 30 may include a heat-affected zone HAZ in a direction toward the distal end SEG of the base substrate 110. For example, it may be seen that a portion of the bending-protection layer 450 has positioned between the distal end SEG of the base substrate 110 and the bending-protection layer 450 from the fact that the heat-affected zone HAZ is positioned at the distal end of the bending-protection layer 450 in plan view. In addition, it may be seen that a portion of the bending-protection layer 450 is removed by the laser process from the fact that the heat-affected zone HAZ is positioned at the distal end of the bending-protection layer 450 in plan view.

Figure 14:
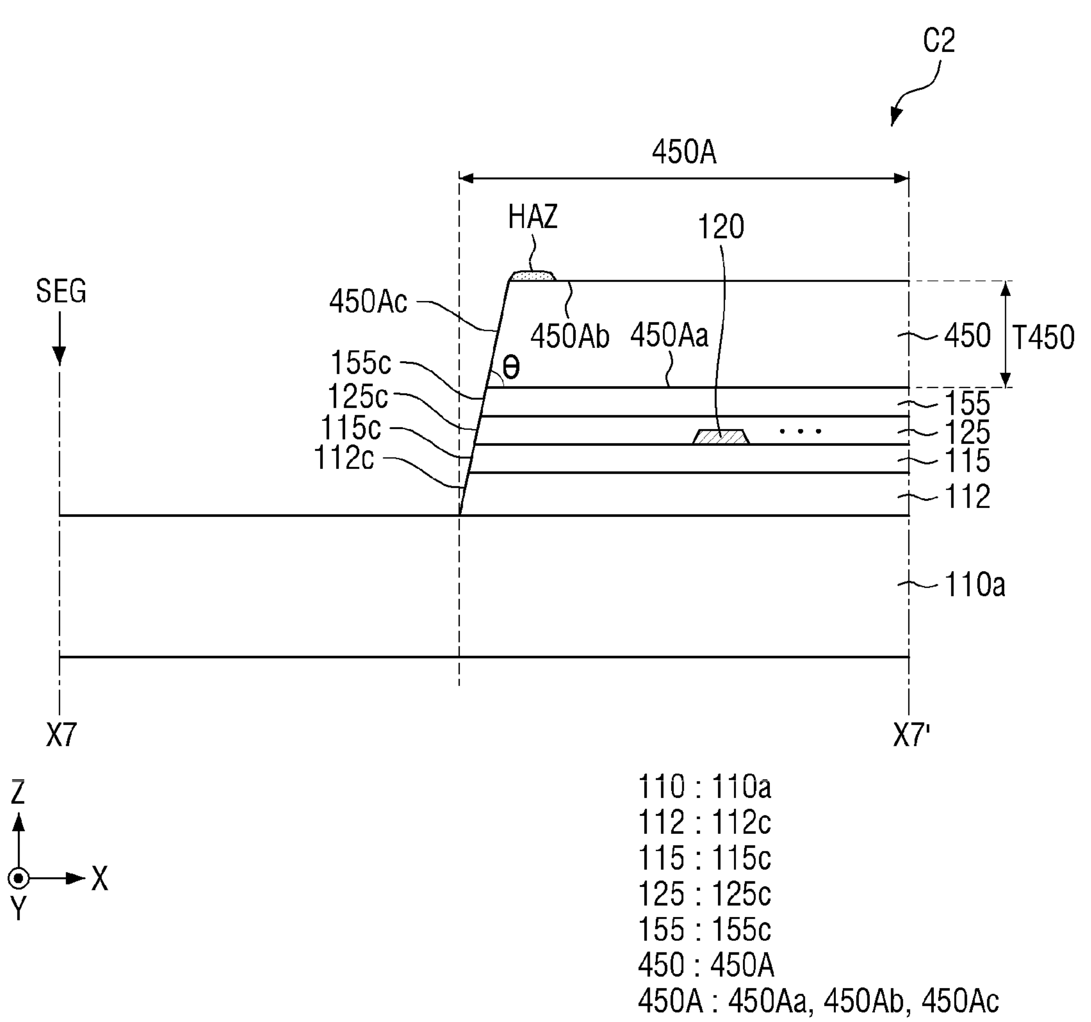
FIG. 14 is a cross-sectional view of a flat area of a display device of FIG. 13 taken along the line X7-X7'.

FIG. 14 is a cross-sectional view of a flat area of a display device of FIG. 13 taken along the line X7-X7'. FIG. 14 illustrates a cross-sectional structure overlapping the second area C2 of the flat area PA in the first direction (X-axis direction).

Referring to FIG. 14, the base substrate 110 overlapping the second area C2 of the flat area PA may be the first base substrate 110*a*. As mentioned above, a portion of the base substrate 110 may be etched to secure the bending area BA and support the flexible substrate 112. A portion of the base substrate 110 overlapping the bending area BA may be etched during the manufacturing process, and as a result, the base substrate 110 may be divided into the first base substrate 110*a* and the second base substrate 110*b*. Therefore, the base substrate 110 overlapping the flat area PA may be the first base substrate 110*a*, and the base substrate 110 overlapping the pad area PDA may be the second base substrate 110*b*.

The flexible substrate 112 may be positioned on the first base substrate 110*a* of the display device 30.

In some embodiments, the flexible substrate 112 of the display device 30 may overlap the second area C2 of the flat area PA, and may include a side surface 112*c* inclined in a direction toward the distal end SEG of the first base substrate 110*a*.

A lower via layer 115 of the display device 30 may be positioned on the flexible substrate 112. The lower via layer 115 of the display device 30 may include a side surface 115*c* inclined in the direction toward the distal end SEG of the first base substrate 110*a*.

An upper via layer 125 of the display device 30 may be positioned on the lower via layer 115. The upper via layer 125 of the display device 30 may include a side surface 125*c* inclined in the direction toward the distal end SEG of the first base substrate 110*a*.

A pixel definition layer 155 of the display device 30 may be positioned on the upper via layer 125. The pixel definition layer 155 of the display device 30 may include a side surface 155*c* inclined in the direction toward the distal end SEG of the first base substrate 110*a*.

In some embodiments, the first portion 450A of the bending-protection layer 450 may include a first surface 450Aa, a second surface 450Ab, and a side surface 450Ac. The first surface 450Aa, the second surface 450Ab, and the side surface 450Ac of the first portion 450A may be connected to each other.

In some embodiments, the side surface 450Ac of the first portion 450A may be positioned in the direction toward the distal end SEG of the first base substrate 110*a*. The first surface 450Aa of the first portion 450A and the side surface 450Ac of the first portion 450A may form an inclined angle θ. As an example, the inclined angle θ may be an acute angle, and the inclined angle θ may be about 60° or more and about 90° or less.

In some embodiments, the second surface 450Ab of the first portion 450A may include a heat-affected zone (HAZ) in the direction toward the distal end SEG of the first base substrate 110*a*.

The heat-affected zone HAZ and the side surface 450Ac included in the first portion 450A of the bending-protection layer 450 may be formed by a laser process. In other words, it may be seen that a portion of the bending-protection layer 450 is removed between the distal end SEG of the first base substrate 110*a* and the first portion 450A of the bending-protection layer 450 of the display device 30 due to the fact that the first portion 450A of the bending-protection layer 450 includes the heat-affected zone HAZ and the side surface 450Ac (the heat-affected zone HAZ being a result of the laser process for removing the abovementioned portion of the bending-protection layer 450).

In some embodiments, the side surface 112*c* of the flexible substrate 112, the side surface 115*c* of the lower via layer 115, the side surface 125*c* of the upper via layer 125, the side surface 155*c* of the pixel definition layer 155, and the side surface 450Ac of the first portion 450A of the bending-protection layer 450 included in the display device 30 may be formed by the same laser process. Therefore, each of the side surface 112*c* of the flexible substrate 112, the side surface 115*c* of the lower via layer 115, the side surface 125*c* of the upper via layer 125, the side surface 155*c* of the pixel definition layer 155, and the side surface 450Ac of the first portion 450A of the bending-protection layer 450 may be aligned with each other and extend to overlap the second area A2 of the flat area PA.

In concluding the detailed description, those skilled in the art will appreciate that many variations and modifications can be made to the described embodiments without substantially departing from the principles of the present disclosure. Therefore, the disclosed embodiments of the present disclosure are used in a generic and descriptive sense and not for purposes of limitation.

What is claimed is:

1. A display device comprising:

a first substrate comprising a first area, a second area, and a bending area that is between the first area and the second area, and comprising a second inclined surface facing the bending area;

a light-emitting element at the first area;

a first bending-protection layer overlapping the bending area; and a second bending-protection layer at the first area and the second area, not overlapping the bending area, and comprising a first inclined surface facing the bending area and aligned with the second inclined surface.

2. The display device of claim 1, wherein the first second bending-protection layer comprises a first portion and a second portion spaced apart from each other with the bending area interposed therebetween, the first portion comprising the first inclined surface, and the second portion comprising a third inclined surface facing the bending area.

3. The display device of claim 2, wherein the first substrate comprises a third portion and a fourth portion spaced apart from each other with the bending area interposed therebetween, the third portion overlapping the first portion, and the fourth portion overlapping the second portion.

4. The display device of claim 3, wherein the fourth portion comprises a fourth inclined surface facing the bending area and aligned with the third inclined surface.

5. The display device of claim 2, wherein the first portion further comprises;

a first surface facing the first substrate; and a second surface opposite to the first surface, and wherein a first inclined angle formed by the first surface and the first inclined surface is an acute angle.

6. The display device of claim 5, wherein the first inclined angle is in a range of 60° to 90°.

7. The display device of claim 5, wherein the second surface comprises a heat-affected zone recessed vertically with respect to the second surface.

8. The display device of claim 5, wherein the second surface comprises a heat-affected zone protruding vertically with respect to the second surface.

9. The display device of claim 8, wherein a width of the heat-affected zone in a direction parallel to the first substrate is in a range of 10 μm to 100 μm.

10. The display device of claim 1, wherein the first bending-protection layer has a thickness in a range of 50 μm to 200 μm.

11. The display device of claim 10, further comprising a signal line for transmitting an electrical signal to the light-emitting element, not overlapping with the second bending-protection layer, and overlapping the first bending-protection layer.

12. The display device of claim 1, further comprising a via layer and a pixel definition layer between the first substrate and the second bending-protection layer, and comprising inclined surfaces facing the bending area aligned with the first inclined surface and the second inclined surface.

* * * * *